(12) United States Patent
Yoshizumi et al.

(10) Patent No.: US 9,508,568 B2
(45) Date of Patent: Nov. 29, 2016

(54) SUBSTRATE PROCESSING APPARATUS AND SUBSTRATE PROCESSING METHOD FOR PERFORMING CLEANING TREATMENT ON SUBSTRATE

(71) Applicant: DAINIPPON SCREEN MFG. CO., LTD., Kyoto (JP)

(72) Inventors: Asuka Yoshizumi, Kyoto (JP); Ayumi Higuchi, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 174 days.

(21) Appl. No.: 14/449,210

(22) Filed: Aug. 1, 2014

(65) Prior Publication Data
US 2015/0040951 A1 Feb. 12, 2015

(30) Foreign Application Priority Data
Aug. 8, 2013 (JP) ................. 2013-165081

(51) Int. Cl.
| H01L 21/67 | (2006.01) |
| --- | --- |
| H01L 21/02 | (2006.01) |
| B08B 7/00 | (2006.01) |
| B08B 7/04 | (2006.01) |
| B08B 3/00 | (2006.01) |
| B08B 3/02 | (2006.01) |
| B08B 3/04 | (2006.01) |

(52) U.S. Cl.
CPC ........... *H01L 21/67051* (2013.01); *B08B 3/02* (2013.01); *B08B 3/04* (2013.01); *H01L 21/02041* (2013.01)

(58) Field of Classification Search
None
See application file for complete search history.

(56) References Cited

U.S. PATENT DOCUMENTS

| 6,432,199 B1* | 8/2002 | Takekuma .............. B05C 11/08 118/319 |
| --- | --- | --- |
| 2008/0142051 A1* | 6/2008 | Hashizume ....... H01L 21/67023 134/23 |
| 2009/0031948 A1 | 2/2009 | Ito |
| 2012/0260946 A1* | 10/2012 | Ogata .............. H01L 21/67034 134/18 |

(Continued)

FOREIGN PATENT DOCUMENTS

| TW | 2009 21771 | 1/2006 |
| --- | --- | --- |
| TW | 2012 46270 | 1/2006 |

OTHER PUBLICATIONS

Taiwanese Office Action dated Aug. 13, 2015 issued in connection with corresponding.

(Continued)

*Primary Examiner* — Eric Golightly
*Assistant Examiner* — Arlyn I Rivera-Cordero
(74) *Attorney, Agent, or Firm* — Ostrolenk Faber LLP

(57) ABSTRACT

A special mode has a second rinsing process which supplies a rinsing liquid to a substrate while holding and rotating the substrate with a spin chuck under operating conditions different from those in a first rinsing process in a normal mode. In the second rinsing process, a processing cup is cleaned with the rinsing liquid flown off from the rotating substrate. In the second rinsing process in which the substrate is held by the spin chuck, the rinsing liquid flown off from the substrate is less prone to collide with chuck members. The provision of a mechanism designed specifically for the cleaning of the cup is not required in the special mode. The special mode is a mode executable when a substrate is present inside a chamber, and can be executed in the middle of lot processing.

7 Claims, 15 Drawing Sheets

(56) References Cited

U.S. PATENT DOCUMENTS

2012/0273011 A1 11/2012 Osada et al. .................. 134/33
2013/0202386 A1* 8/2013 Matsuyama ...... H01L 21/67712
                                                        414/161

OTHER PUBLICATIONS

Taiwanese application No. 103120230 and partial Japanese & English translations thereof.

* cited by examiner

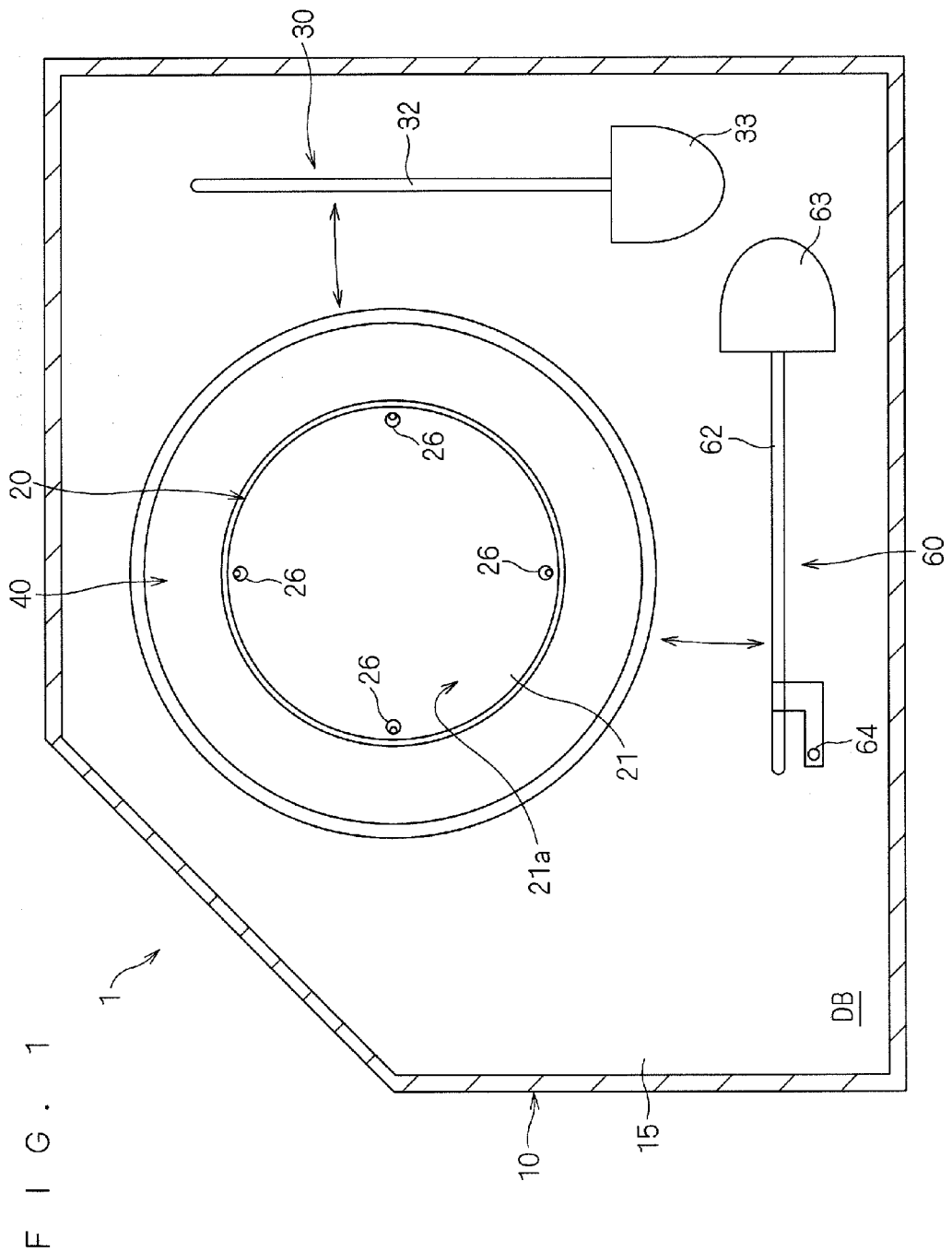

F I G. 5
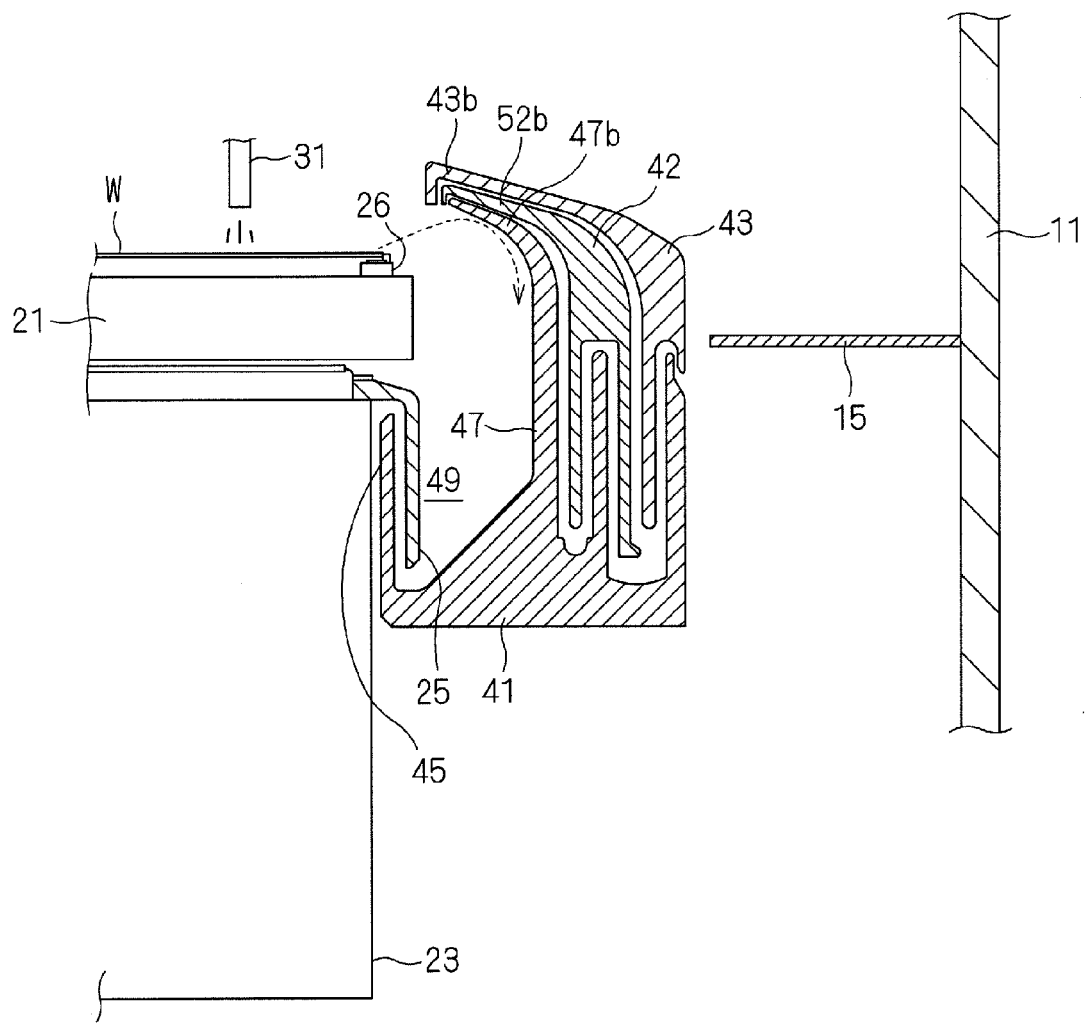

F I G . 6
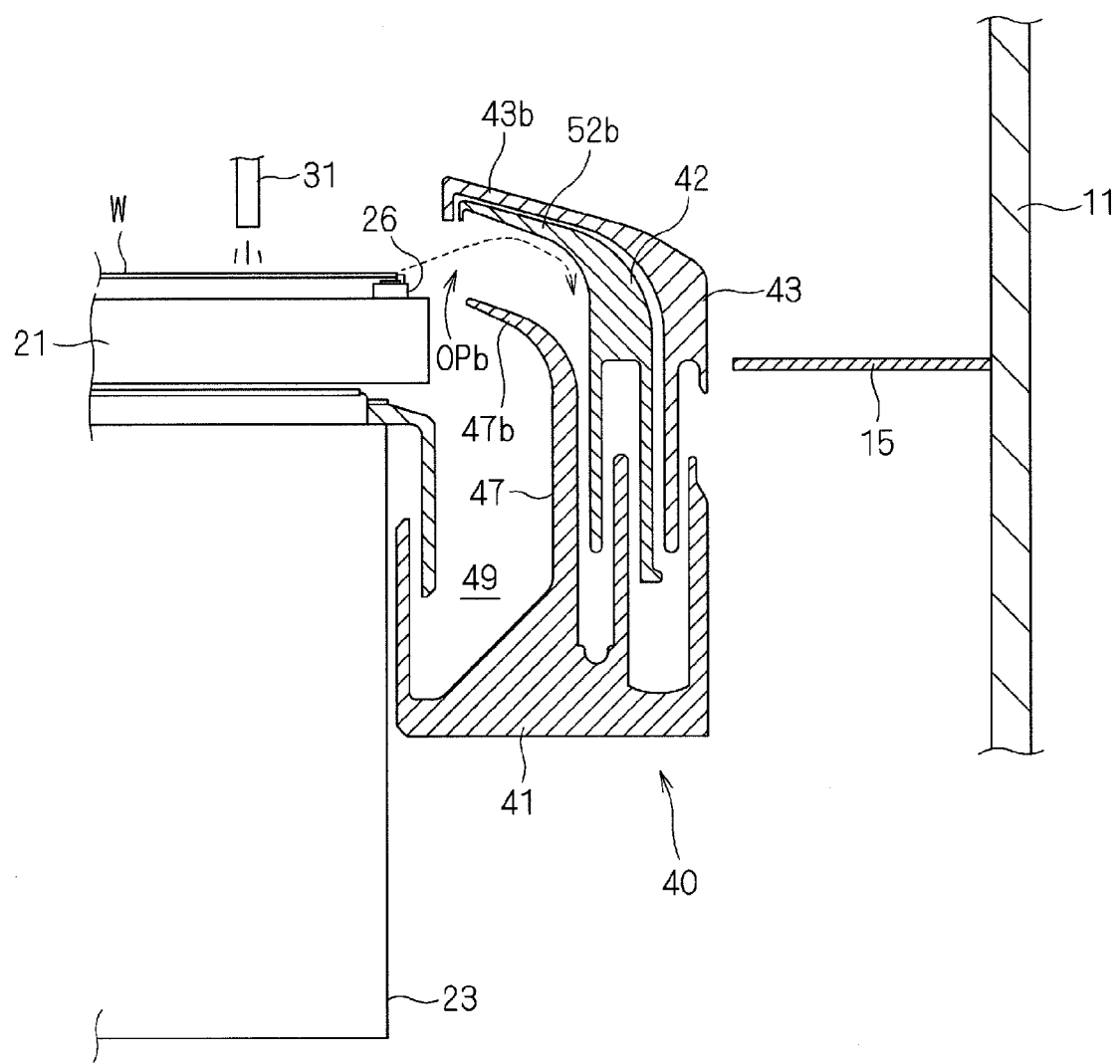

F I G . 9
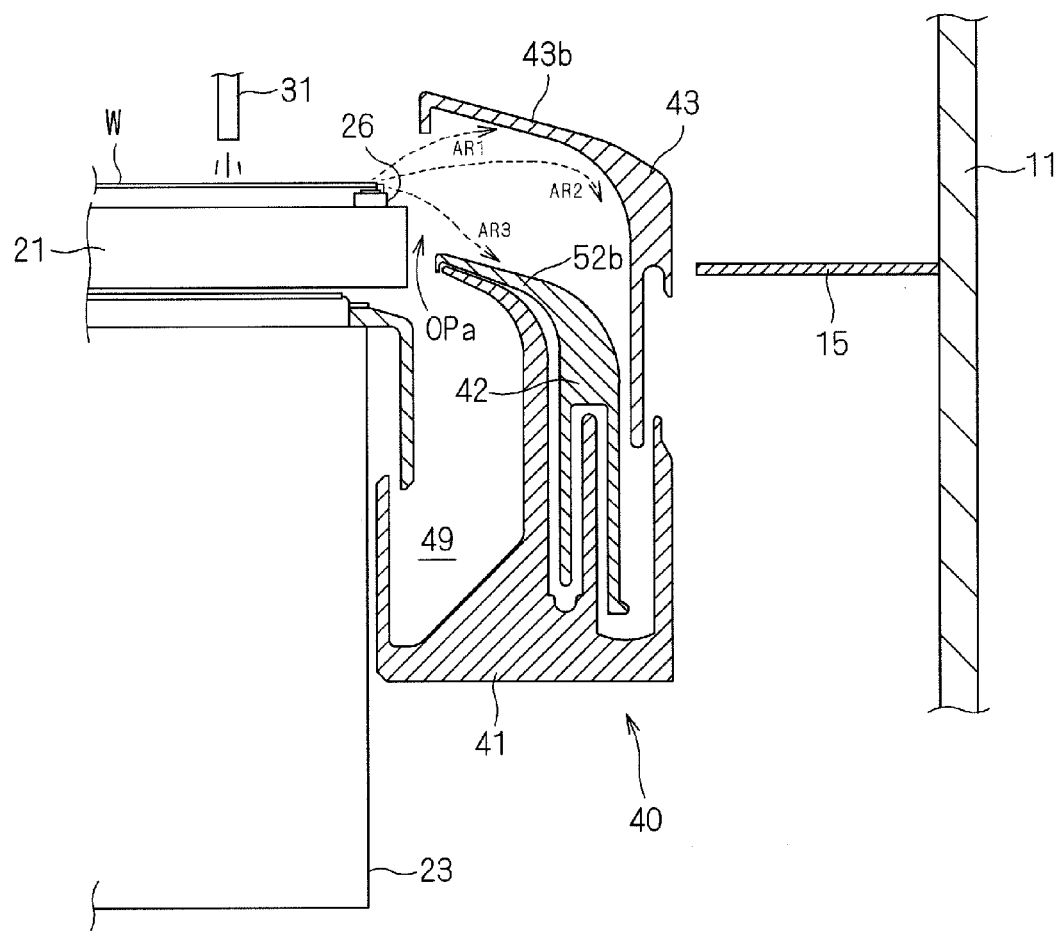

F I G . 1 0
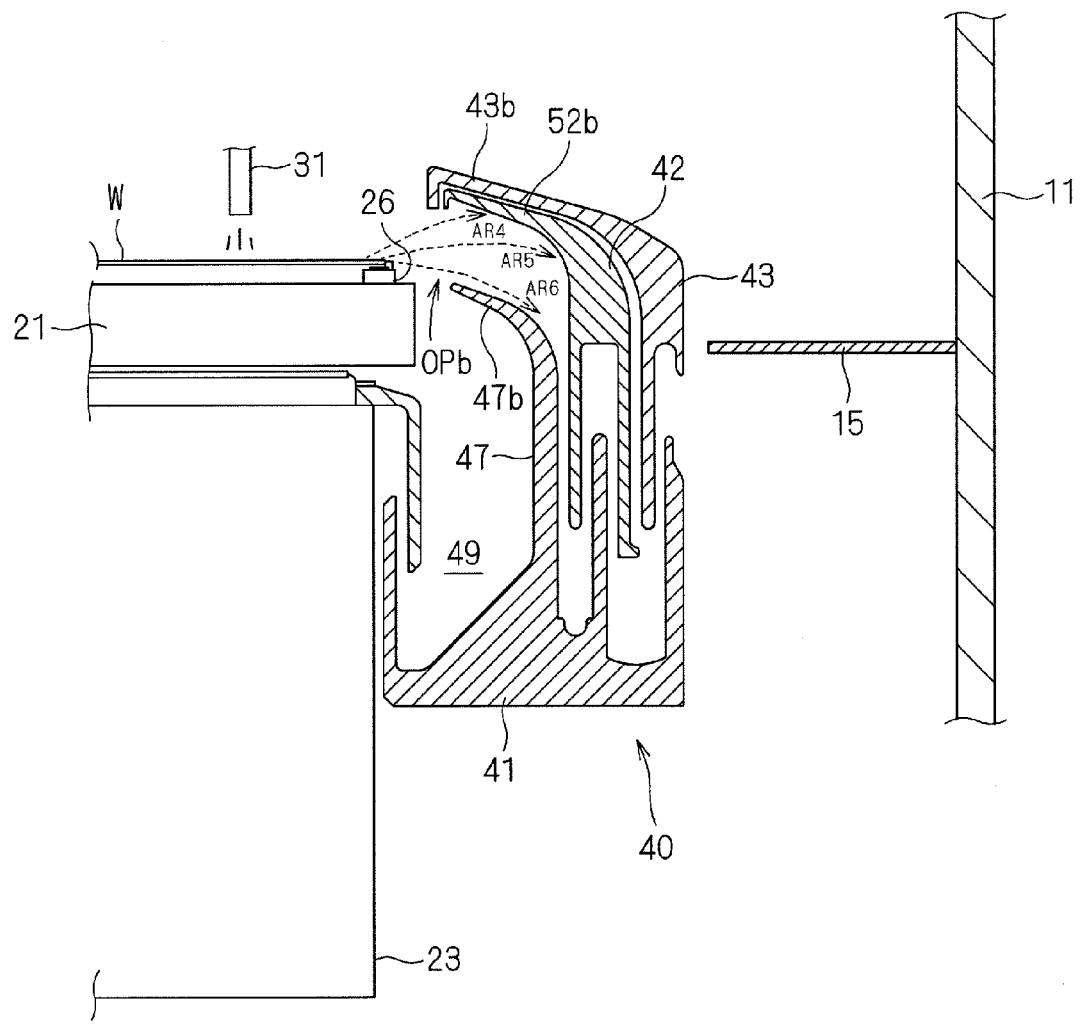

F I G . 1 1
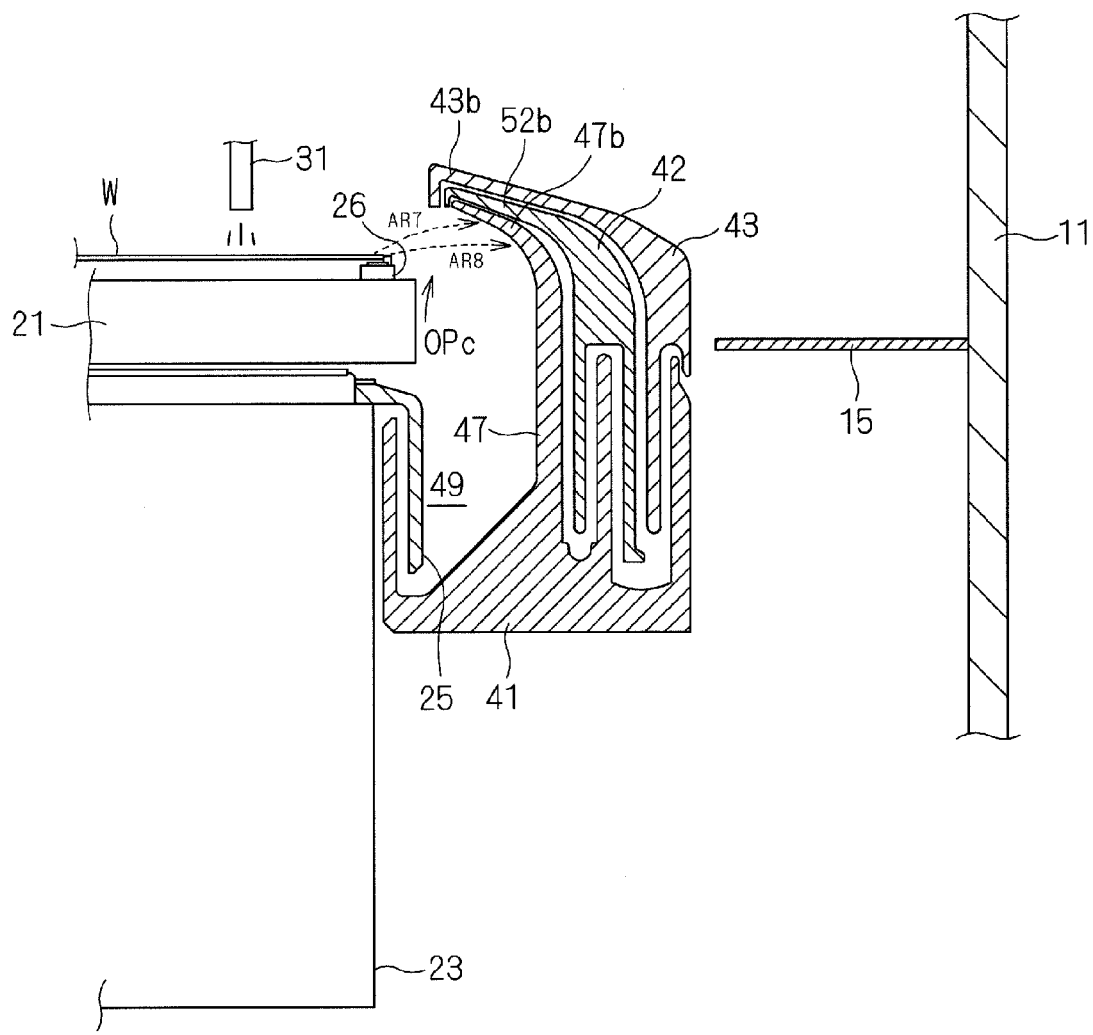

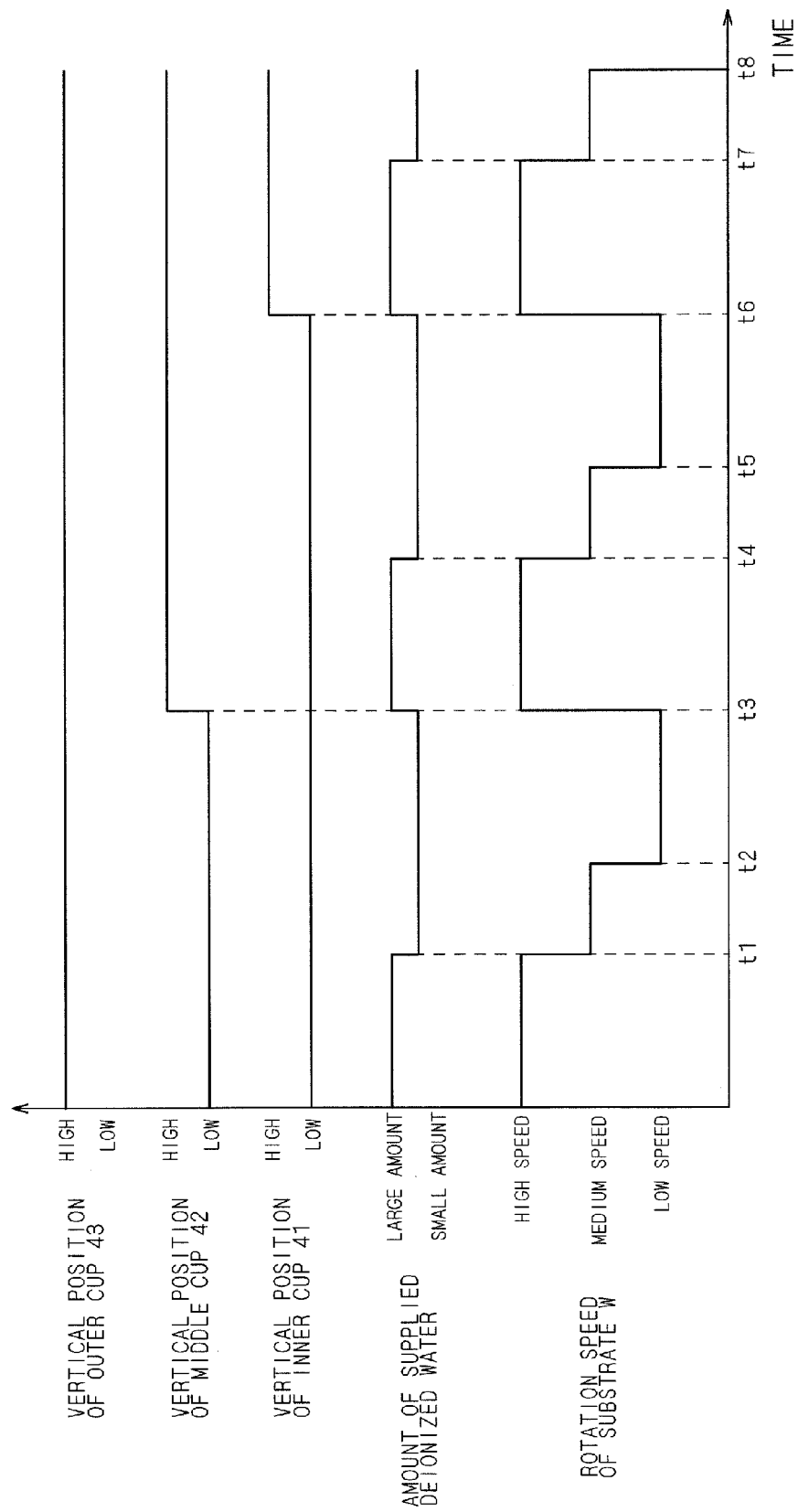

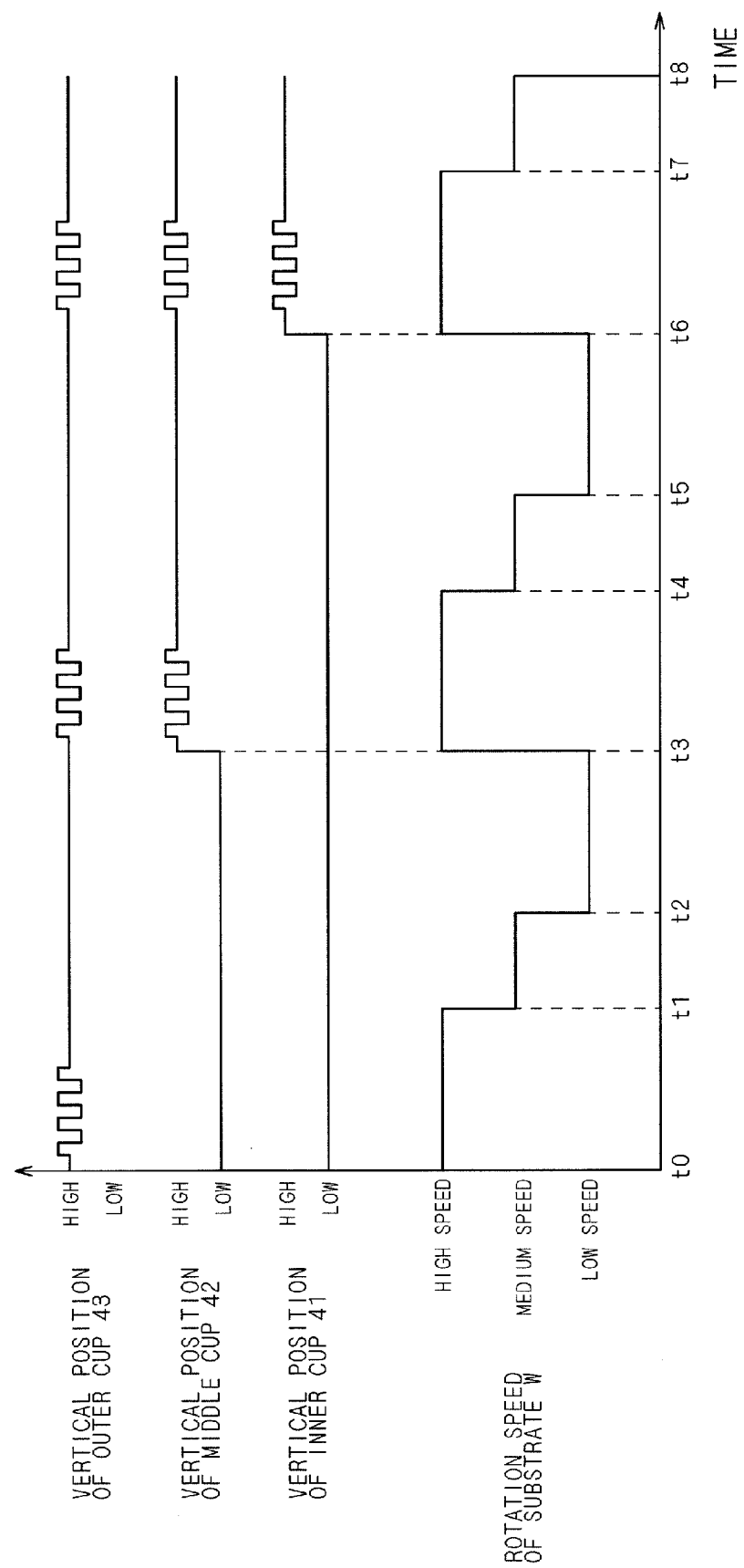

F I G. 1 5
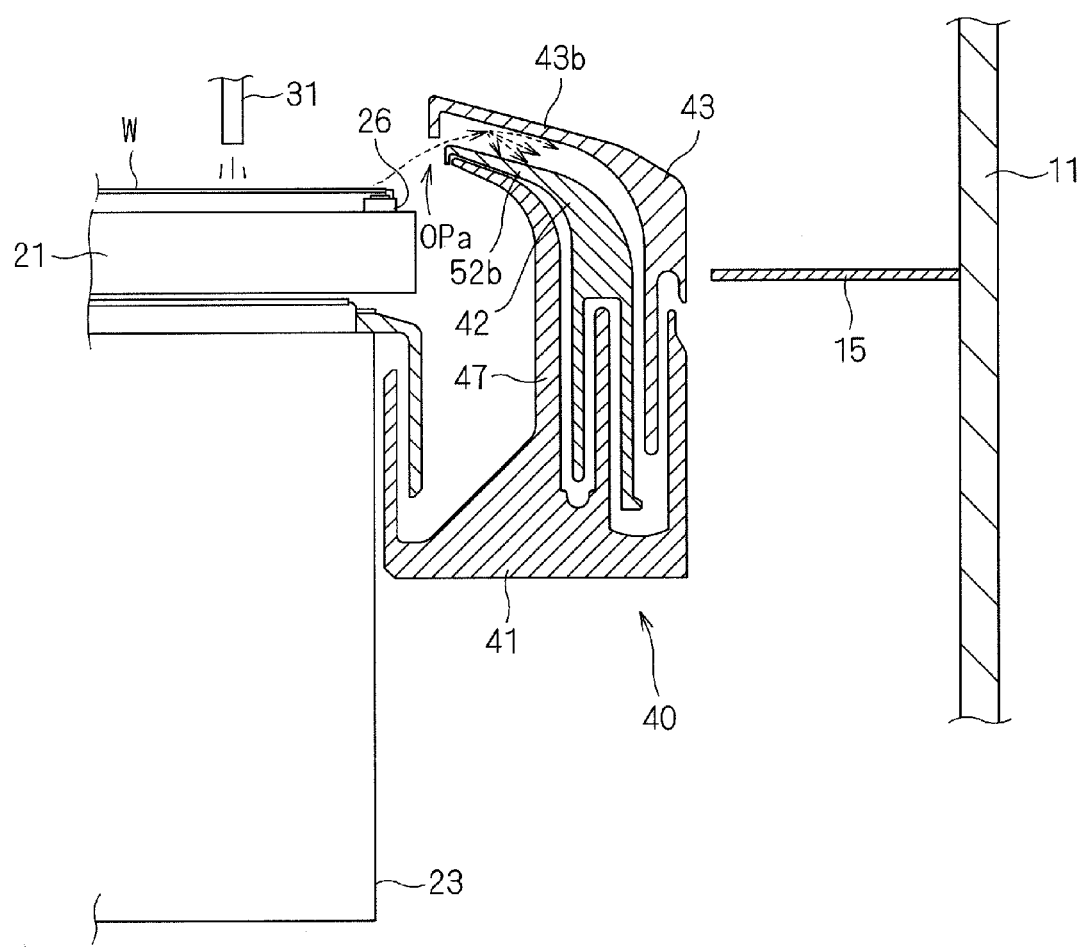

SUBSTRATE PROCESSING APPARATUS AND SUBSTRATE PROCESSING METHOD FOR PERFORMING CLEANING TREATMENT ON SUBSTRATE

BACKGROUND OF THE INVENTION

Field of the Invention

The present invention relates to a substrate processing apparatus and a substrate processing method for performing cleaning treatment on a substrate.

Description of the Background Art

Substrate processing apparatuses which perform a drying process after performing surface treatments including liquid chemical treatment using a liquid chemical, rinsing treatment using a rinsing liquid such as deionized water, and the like on substrates have hitherto been used in the steps of manufacturing substrates. Examples of such substrate processing apparatuses which have been used include a single-wafer type apparatus which processes substrates one by one, and a batch type apparatus which processes substrates in one batch.

In general, the single-wafer type substrate processing apparatus performs the liquid chemical treatment which supplies a liquid chemical to a surface of a rotating substrate and the rinsing treatment which supplies deionized water to the surface of the rotating substrate, and thereafter rotates the substrate at a high speed to perform a spin-drying process. At this time, the greater part of such a processing liquid flying off to adhere to the inner wall of a cup surrounding a spin chuck flows downwardly along the inner wall of the cup and is then drained. However, part of the processing liquid on the inner wall of the cup remains adhering thereto and is not collected in some cases. The processing liquid adhering to the inner wall of the cup becomes particles, when dried, to become a cause of contamination of the substrate. To prevent this, cup cleaning treatment for cleaning the cup is in general performed each time a specific number (typically, a specific lot) of substrates are processed. Such a single-wafer type substrate processing apparatus is disclosed in U.S. Patent Application Publication No. 2012/273011, for example.

The substrate processing apparatus disclosed in U.S. Patent Application Publication No. 2012/273011 includes: a spin chuck for rotating a substrate while holding the substrate in a substantially horizontal attitude; a nozzle for supplying a processing liquid onto the upper surface of the substrate held by the spin chuck; and a cup surrounding the spin chuck and for receiving the processing liquid flying off from the substrate.

In this substrate processing apparatus, the rinsing liquid (typically, deionized water) is supplied to a spin base portion (circular plate-like portion) of the spin chuck rotating without holding the substrate. The supplied rinsing liquid is flown off from the spin base to the cup and its surroundings by centrifugal force caused by the rotation. Thus, the places to which the rinsing liquid is flown are cleaned.

Unfortunately, the technique of supplying the rinsing liquid to the rotating spin base to fly off the rinsing liquid as disclosed in U.S. Patent Application Publication No. 2012/273011 causes the rinsing liquid to collide with chuck mechanisms (typically, of a protruding shape) included in the spin chuck and for grasping the substrate, thereby making it difficult in some cases to fly off the rinsing liquid appropriately to the places to be cleaned to which the liquid chemical adheres.

There is another technique in which a substrate processing apparatus includes a tool designed specifically for the cup cleaning treatment, and the rinsing liquid is supplied to the cleaning tool grasped and rotated by the spin chuck. This technique avoids the aforementioned problem of the collision of the rinsing liquid with the chuck mechanisms, but presents another problem such that the cleaning tool must be attached and detached for every cup cleaning treatment to result in the decrease in throughput. The provision of the component designed specifically for the cup cleaning treatment in addition to the components required for the substrate processing gives rise to another problem such that the substrate processing apparatus is increased in size.

In this type of substrate processing apparatus, it is common practice to perform the aforementioned cup cleaning treatment during a time interval between the end of the substrate processing of a lot (a specific number of substrates in a group to be subjected to the same processing) and the start of the substrate processing of its subsequent lot. For this reason, if there arises a need to perform the aforementioned cup cleaning treatment in the middle of the lot processing, it has been difficult to start the cup cleaning treatment before the completion of the lot processing being performed.

SUMMARY OF THE INVENTION

The present invention is intended for a substrate processing apparatus for processing a plurality of substrates in succession.

According to one aspect of the present invention, the substrate processing apparatus comprises: a processing apparatus body including a substrate holding part for holding a substrate, a rotary drive part for rotating the substrate holding part, a liquid chemical supply part for supplying a liquid chemical to the substrate held by the substrate holding part, a rinsing liquid supply part for supplying a rinsing liquid to the substrate held by the substrate holding part, and a cup surrounding the substrate holding part; and a controller in which a plurality of substrate processing modes are previously set, the controller controlling the processing apparatus body to select one of the substrate processing modes for each of the plurality of substrates, thereby causing the selected substrate processing mode to be executed, the substrate processing modes including: a normal mode having a first liquid chemical process which supplies the liquid chemical to the substrate while rotating the substrate held by the substrate holding part to perform liquid chemical treatment on the substrate, and a first rinsing process which supplies the rinsing liquid to the substrate while rotating the substrate held by the substrate holding part to rinse away the liquid chemical from the substrate; and a special mode having a second rinsing process which supplies the rinsing liquid to the substrate while rotating the substrate held by the substrate holding part under an operating condition different from that in the first rinsing process to clean the cup with the rinsing liquid flown off from the rotating substrate.

In the special mode in which the substrate is held by the substrate holding part, the rinsing liquid flown off from the substrate is less prone to collide with a holding mechanism (e.g., a chuck mechanism) of the substrate holding part. This allows the rinsing liquid to appropriately fly off to the places of the cup to be cleaned. The provision of a mechanism designed specifically for cleaning, such as a cleaning tool, is not required in the special mode. This prevents the increase in size of the substrate processing apparatus. The special mode is a mode executable when a substrate is present inside the substrate processing apparatus, and can be executed in the middle of lot processing.

Preferably, the special mode further has a second liquid chemical process corresponding to the first liquid chemical process in the normal mode.

Thus, like a substrate subjected to the normal mode, a substrate subjected to the special mode can be used as a final product.

Preferably, the second rinsing process in the special mode has a place adjustment sub-process which moves the cup upwardly and downwardly to adjust the place where the rinsing liquid flying off from the substrate collides with the cup.

This achieves the cleaning of the cup with accuracy.

Preferably, the second rinsing process in the special mode has a speed adjustment sub-process which makes a variable adjustment to the speed of rotation of the substrate.

The behavior of the rinsing liquid flown off from the substrate depends on the speed of rotation of the substrate. Thus, the variable adjustment of the rotation speed allows the cleaning of the cup over a wide area with accuracy.

Preferably, the second rinsing process in the special mode has a supply amount adjustment sub-process which makes a variable adjustment to the amount of rinsing liquid supplied to the substrate.

The behavior of the rinsing liquid flown off from the substrate depends on the amount of rinsing liquid supplied to the substrate. Thus, the variable adjustment of the amount of supplied rinsing liquid allows the cleaning of the cup with accuracy.

The present invention is also intended for a method of processing a plurality of substrates in succession by using a processing apparatus body and a controller for controlling the processing apparatus body, the processing apparatus body including a substrate holding part for holding a substrate, a rotary drive part for rotating the substrate holding part, a liquid chemical supply part for supplying a liquid chemical to the substrate held by the substrate holding part, a rinsing liquid supply part for supplying a rinsing liquid to the substrate held by the substrate holding part, and a cup surrounding the substrate holding part.

According to one aspect of the present invention, the method comprises the steps of: (a) previously setting a plurality of substrate processing modes in the controller; and (b) selecting one of the substrate processing modes set in the controller for each of the plurality of substrates to cause the selected substrate processing mode to be executed, the substrate processing modes including: a normal mode having a first liquid chemical process which supplies the liquid chemical to the substrate while rotating the substrate held by the substrate holding part to perform liquid chemical treatment on the substrate, and a first rinsing process which supplies the rinsing liquid to the substrate while rotating the substrate held by the substrate holding part to rinse away the liquid chemical from the substrate; and a special mode having a second rinsing process which supplies the rinsing liquid to the substrate while rotating the substrate held by the substrate holding part under an operating condition different from that in the first rinsing process to clean the cup with the rinsing liquid flown off from the rotating substrate.

In the special mode in which the substrate is held by the substrate holding part, the rinsing liquid flown off from the substrate is less prone to collide with a holding mechanism (e.g., a chuck mechanism) of the substrate holding part. This allows the rinsing liquid to appropriately fly off to the places of the cup to be cleaned. The provision of a mechanism designed specifically for cleaning, such as a cleaning tool, is not required in the special mode. This prevents the increase in size of the substrate processing apparatus. The special mode is a mode executable when a substrate is present inside the substrate processing apparatus, and can be executed in the middle of lot processing.

Preferably, the special mode further has a second liquid chemical process corresponding to the first liquid chemical process in the normal mode.

Thus, like a substrate subjected to the normal mode, a substrate subjected to the special mode can be used as a final product.

Preferably, the second rinsing process in the special mode has a place adjustment sub-process which moves the cup upwardly and downwardly to adjust the place where the rinsing liquid flying off from the substrate collides with the cup.

This achieves the cleaning of the cup with accuracy.

Preferably, the second rinsing process in the special mode has a speed adjustment sub-process which makes a variable adjustment to the speed of rotation of the substrate.

The behavior of the rinsing liquid flown off from the substrate depends on the speed of rotation of the substrate. Thus, the variable adjustment of the rotation speed allows the cleaning of the cup over a wide area with accuracy.

Preferably, the second rinsing process in the special mode has a supply amount adjustment sub-process which makes a variable adjustment to the amount of rinsing liquid supplied to the substrate.

The behavior of the rinsing liquid flown off from the substrate depends on the amount of rinsing liquid supplied to the substrate. Thus, the variable adjustment of the amount of supplied rinsing liquid allows the cleaning of the cup with accuracy.

It is therefore an object of the present invention to allow a rinsing liquid to fly off appropriately to a place to be cleaned, and to allow cup cleaning treatment to start before the completion of lot processing being executed while preventing the increase in size of an apparatus.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a top plan view of a substrate processing apparatus according to a preferred embodiment of the present invention;

FIG. 5 is a vertical sectional view of the substrate processing apparatus which shows deionized water flying off from the substrate toward an inner cup in the normal mode according to the preferred embodiment;

FIG. 6 is a vertical sectional view of the substrate processing apparatus which shows the deionized water flying off from the substrate toward a middle cup in the normal mode according to the preferred embodiment;

FIG. 9 is a vertical sectional view of the substrate processing apparatus which shows the liquid chemical flying off from the substrate toward the outer cup in the special mode according to the preferred embodiment;

FIG. 10 is a vertical sectional view of the substrate processing apparatus which shows the liquid chemical flying off from the substrate toward the middle cup in the special mode according to the preferred embodiment;

FIG. 11 is a vertical sectional view of the substrate processing apparatus which shows the liquid chemical flying off from the substrate toward the inner cup in the special mode according to the preferred embodiment;

FIGS. 12 and 13 are timing diagrams of the cup cleaning process according to modifications;

FIG. 15 is a vertical sectional view of the substrate processing apparatus which shows the liquid chemical flying off from the substrate toward the inner cup in the special mode according to a modification.

DESCRIPTION OF THE PREFERRED EMBODIMENTS

1 Preferred Embodiment 1.1 Configuration of Substrate Processing Apparatus 1

A preferred embodiment according to the present invention will now be described in detail with reference to the drawings.

Figure 2:
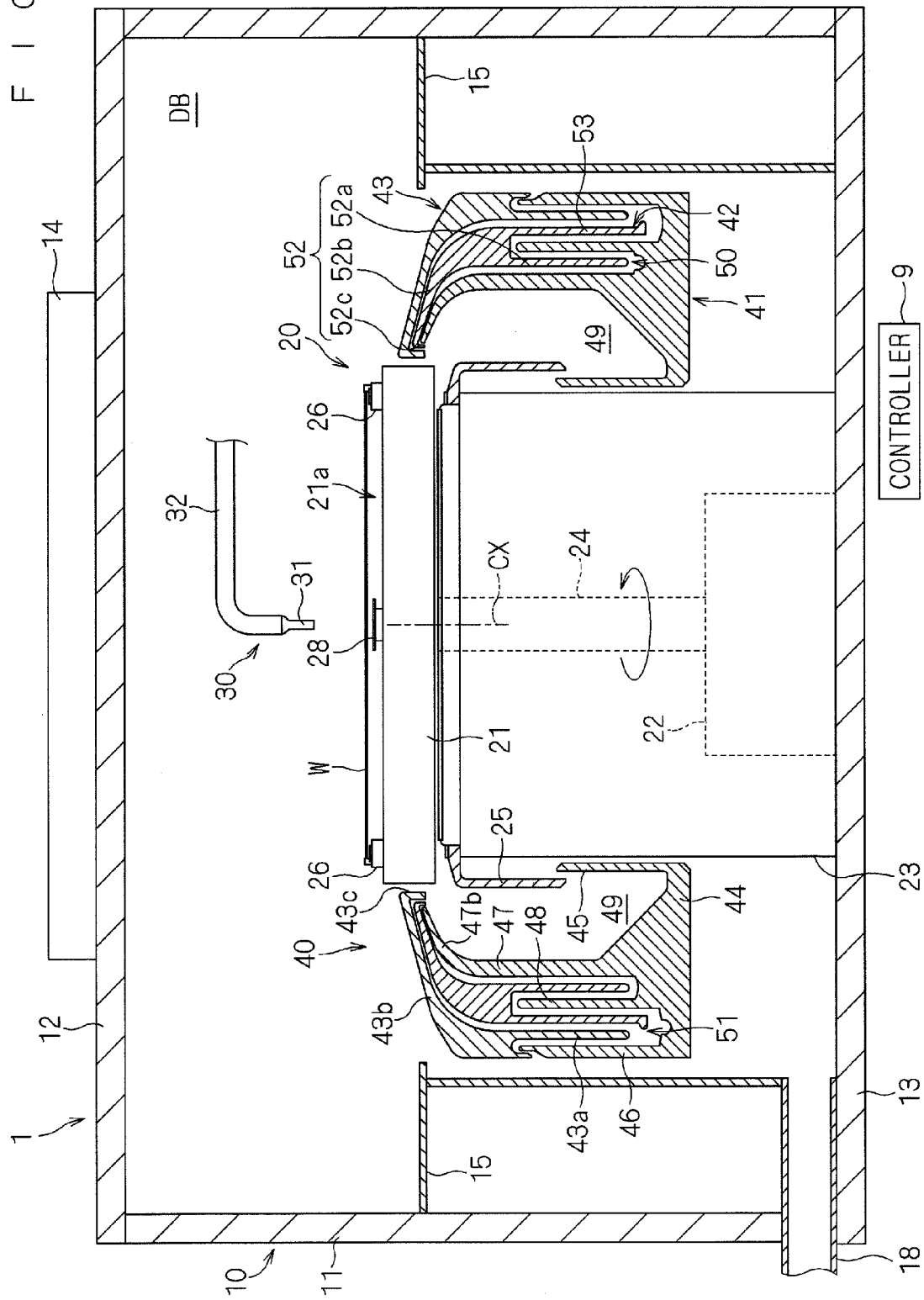
FIG. 2 is a vertical sectional view of the substrate processing apparatus according to the preferred embodiment.

FIG. 1 is a top plan view of a substrate processing apparatus 1 according to the preferred embodiment of the present invention. FIG. 2 is a vertical sectional view of the substrate processing apparatus 1. The substrate processing apparatus 1 is a single-wafer type processing apparatus which processes semiconductor substrates W one by one. The substrate processing apparatus 1 performs liquid chemical treatment (in which a cleaning liquid including a SC-1 (standard cleaning 1; $NH_4OH$—$H_2O_2$—$H_2O$) solution, a DHF solution, an SC-2 (standard cleaning 2; HCl—$H_2O_2$—$H_2O$) solution, and the like is supplied as a liquid chemical) and rinsing treatment (in which deionized water is supplied to remove the liquid chemical) are performed on a circular silicon substrate W, and thereafter performs a drying process. FIG. 1 shows that no substrate W is held by a spin chuck 20, and FIG. 2 shows that a substrate W is held by the spin chuck 20.

The substrate processing apparatus 1 principally includes: the spin chuck 20 which holds a substrate W in a horizontal attitude (an attitude such that the normal to the substrate W extends in a vertical direction); an upper surface processing liquid nozzle 30 for supplying a processing liquid onto the upper surface of the substrate W held by the spin chuck 20; and a processing cup 40 surrounding the spin chuck 20. The spin chuck 20, the upper surface processing liquid nozzle 30 and the processing cup 40 are provided inside a chamber 10. A partition plate 15 which divides the inside space of the chamber 10 into upper and lower spaces is provided around the processing cup 40 inside the chamber 10. The term "processing liquid" as used herein is a generic term including both a liquid chemical and a rinsing liquid (deionized water).

The chamber 10 includes side walls 11 extending in a vertical direction, a ceiling wall 12 which closes the upper side of the space surrounded by the side walls 11, and a floor wall 13 which closes the lower side thereof. The space surrounded by the side walls 11, the ceiling wall 12 and the floor wall 13 is a processing space for a substrate W. Part of the side walls 11 of the chamber 10 is provided with a transport opening for transporting a substrate W into and out of the chamber 10 therethrough, and a shutter for opening and closing the transport opening (both not shown).

A fan filter unit (FFU) 14 for further cleaning air in a clean room in which the substrate processing apparatus 1 is installed to supply the cleaned air into the processing space inside the chamber 10 is mounted on the ceiling wall 12 of the chamber 10. The fan filter unit 14 includes a fan for taking in the air in the clean room to send out the air into the chamber 10, and a filter (for example, a HEPA filter), and forms a downflow of clean air in the processing space inside the chamber 10. To uniformly distributing the clean air supplied from the fan filter unit 14, a punched plate having a multiplicity of air outlets may be provided immediately under the ceiling wall 12.

The spin chuck 20 (substrate holding part) includes: a disk-shaped spin base 21 fixed in a horizontal attitude on the upper end of a rotary shaft 24 extending in a vertical direction; a spin motor 22 disposed under the spin base 21 to rotate the rotary shaft 24; and a tubular cover member 23 surrounding the spin motor 22. The disk-shaped spin base 21 has an outside diameter slightly greater than the diameter of a circular substrate W held by the spin chuck 20. The spin base 21 has a holding surface 21a opposed to the entire lower surface of the substrate W held thereon.

A plurality of (in the present preferred embodiment, four) chuck members 26 are provided upright in a peripheral portion of the holding surface 21a of the spin base 21. The chuck members 26 are equally spaced (at intervals of 90 degrees in the case of the four chuck members 26 as in the preferred embodiment) along the circumference of a circle corresponding to the outer circumference of the circular substrate W. The chuck members 26 are driven in conjunction with each other by a linkage mechanism (not shown) housed in the spin base 21. The spin chuck 20 brings the chuck members 26 into abutment with edges of the substrate W to hold the substrate W therebetween. Thus, the substrate W is held in a horizontal attitude at a predetermined distance from the holding surface 21a while being positioned close to the holding surface 21a over the spin base 21 (with reference to FIG. 2). The spin chuck 20 is able to separate the chuck members 26 from the edges of the substrate W to release the holding of the substrate W.

The cover member 23 covering the spin motor 22 has a lower end fixed to the floor wall 13 of the chamber 10, and an upper end positioned immediately under the spin base 21. An upper end portion of the cover member 23 is provided with a collar member 25 extending substantially horizontally outwardly from the cover member 23 and then bent downwardly. While the spin chuck 20 causes the chuck members 26 to hold a substrate W therebetween, the spin motor 22 (a rotary drive part) rotates the rotary shaft 24 to thereby rotate the substrate W about an axis CX extending in a vertical direction and passing through the center of the substrate W. The driving of the spin motor 22 is controlled by a controller 9.

The upper surface processing liquid nozzle 30 includes a nozzle arm 32, and an ejection head 31 mounted to the distal end of the nozzle arm 32. The nozzle arm 32 has a proximal end fixedly coupled to a nozzle base 33. The nozzle base 33 is pivotable about an axis extending in a vertical direction by a motor not shown. The pivotal movement of the nozzle base 33 causes the ejection head 31 of the upper surface processing liquid nozzle 30 to move along an arcuate path in a horizontal plane between a processing position over the spin chuck 20 and a standby position outside the processing cup 40. The upper surface processing liquid nozzle 30 is configured so that two or more types of processing liquids (including at least the rinsing liquid (deionized water)) are supplied thereto. A processing liquid ejected from the ejection head 31 of the upper surface processing liquid nozzle 30 at the processing position is supplied to the upper surface of the substrate W held by the spin chuck 20. The pivotal movement of the nozzle base 33 allows the upper surface processing liquid nozzle 30 to swing over the holding surface 21a of the spin base 21. In the present preferred embodiment, an instance will be described in which the upper surface processing liquid nozzle 30 is capable of supplying the liquid chemical and the rinsing liquid, so that the upper surface processing liquid nozzle 30 functions as a liquid chemical supply part and as a rinsing liquid supply part.

A lower surface processing liquid nozzle 28 is provided which extends in a vertical direction inside the rotary shaft 24. The lower surface processing liquid nozzle 28 has an upper end opening provided in a position opposed to the center of the lower surface of the substrate W held by the spin chuck 20. The lower surface processing liquid nozzle 28 is also configured so that two or more types of processing liquids are supplied thereto. A processing liquid ejected from the lower surface processing liquid nozzle 28 is supplied to the lower surface of the substrate W held by the spin chuck 20.

The substrate processing apparatus 1 further includes a two-fluid nozzle 60 separately from the upper surface processing liquid nozzle 30. The two-fluid nozzle 60 is a cleaning nozzle which mixes the rinsing liquid such as deionized water and a pressurized gas together to produce droplets, thereby jetting out a fluid mixture of the droplets and a gas toward the substrate W. The two-fluid nozzle 60 includes a nozzle arm 62, a liquid head (not shown) mounted to the distal end of the nozzle arm 62, a support member provided so as to branch off from the nozzle arm 62, and a gas head 64 mounted to the support member. The nozzle arm 62 has a proximal end fixedly coupled to a nozzle base 63. The nozzle base 63 is pivotable about an axis extending in a vertical direction by a motor not shown. The pivotal movement of the nozzle base 63 causes the two-fluid nozzle 60 to move arcuately in a horizontal direction between a processing position over the spin chuck 20 and a standby position outside the processing cup 40. The rinsing liquid such as deionized water is supplied to the liquid head, and a pressurized inert gas (in the present preferred embodiment, nitrogen gas ($N_2$)) is supplied to the gas head 64. The fluid mixture of the rinsing liquid jetted out from the two-fluid nozzle 60 at the processing position is sprayed onto the upper surface of the substrate W held by the spin chuck 20.

The processing cup 40 surrounding the spin chuck 20 includes a plurality of cups, i.e. an inner cup 41, a middle cup 42 and an outer cup 43, which are upwardly and downwardly movable independently of each other. The inner cup 41 surrounds the spin chuck 20, and has a shape substantially rotationally symmetric with respect to the axis CX passing through the center of the substrate W held by the spin chuck 20. The inner cup 41 includes: a bottom portion 44 of an annular shape as seen in plan view; a cylindrical inner wall portion 45 extending upwardly from an inner periphery of the bottom portion 44; a cylindrical outer wall portion 46 extending upwardly from an outer periphery of the bottom portion 44; a first guide portion 47 extending upwardly from between the inner wall portion 45 and the outer wall portion 46, and having an upper end portion 47b extending obliquely upwardly toward the center (toward the axis CX of the substrate W held by the spin chuck 20) in the form of a smooth arc; and a cylindrical middle wall portion 48 extending upwardly from between the first guide portion 47 and the outer wall portion 46. These portions 44, 45, 46, 47 and 48 are formed integrally.

The inner wall portion 45 has such a length as to be put between the cover member 23 and the collar member 25, with appropriate clearance left therebetween, when the inner cup 41 is at its uppermost elevated position (FIG. 5). The middle wall portion 48 has such a length as to be put between a second guide portion 52 and a processing liquid separation wall 53 of the middle cup 42 which are to be described later, with appropriate clearance left therebetween, when the inner cup 41 and the middle cup 42 are at their closest positions.

The first guide portion 47 has the upper end portion 47b extending obliquely upwardly toward the center (toward the axis CX of the substrate W) in the form of a smooth arc. The space between the inner wall portion 45 and the first guide portion 47 serves as a waste channel 49 for collecting and discarding a used processing liquid therein. The space between the first guide portion 47 and the middle wall portion 48 serves as an annular inner collection channel 50 for collecting a used processing liquid therein. The space between the middle wall portion 48 and the outer wall portion 46 serves as an annular outer collection channel 51 for collecting a processing liquid different in type from that in the inner collection channel 50.

The waste channel 49 is connected to an exhaust and drainage mechanism (not shown) for discharging the processing liquid collected in the waste channel 49 and for forcibly exhausting the gas from the waste channel 49. For example, four exhaust and drainage mechanisms are equally spaced in the circumferential direction of the waste channel 49. The inner collection channel 50 and the outer collection channel 51 are connected to a collection mechanism (not shown) for sending the processing liquid collected in the inner collection channel 50 and the outer collection channel 51 into a collection tank (not shown) provided outside the substrate processing apparatus 1. The inner collection channel 50 and the outer collection channel 51 have respective bottom portions inclined at slight angles with respect to the horizontal direction, and the collection mechanism is connected to the lowest parts of the respective bottom portions. This achieves the smooth collection of the processing liquid flowing into the inner collection channel 50 and the outer collection channel 51.

The middle cup 42 surrounds the spin chuck 20, and has a shape substantially rotationally symmetric with respect to the axis CX passing through the center of the substrate W held by the spin chuck 20. The middle cup 42 includes the second guide portion 52, and the cylindrical processing liquid separation wall 53 coupled to the second guide portion 52, both of which are formed integrally.

The second guide portion 52 has a lower end portion 52a having a cylindrical shape about the axis CX, an upper end portion 52b extending obliquely upwardly from the upper end of the lower end portion 52a toward the center (toward the axis CX of the substrate W) in the form of a smooth arc, and a folded portion 52c formed by folding back the distal end portion of the upper end portion 52b downwardly. These portions 52*a*, 52*b* and 52*c* are provided outside the first guide portion 47 of the inner cup 41. The lower end portion 52*a* is put inside the inner collection channel 50, with appropriate clearance left between the first guide portion 47 and the middle wall portion 48, when the inner cup 41 and the middle cup 42 are at their closest positions. The upper end portion 52*b* is provided over the upper end portion 47*b* of the first guide portion 47 of the inner cup 41, and is close to the upper end portion 47*b* of the first guide portion 47, with slight clearance left therebetween, when the inner cup 41 and the middle cup 42 are at their closest positions. The folded portion 52*c* formed by folding back the distal end portion of the upper end portion 52*b* downwardly has such a length as to be put in horizontally side-by-side relation to the distal end of the upper end portion 47*b* of the first guide portion 47 when the inner cup 41 and the middle cup 42 are at their closest positions.

The upper end portion 52*b* of the second guide portion 52 has a thickness increasing in a downward direction. The processing liquid separation wall 53 has a cylindrical shape extending downwardly from the outer periphery of the lower end of the upper end portion 52*b*. The processing liquid separation wall 53 is put inside the outer collection channel 51, with appropriate clearance left between the middle wall portion 48 and the outer cup 43, when the inner cup 41 and the middle cup 42 are at their closest positions.

The outer cup 43 outside the second guide portion 52 of the middle cup 42 surrounds the spin chuck 20, and has a shape substantially rotationally symmetric with respect to the axis CX passing through the center of the substrate W held by the spin chuck 20. The outer cup 43 functions as a third guide portion. The outer cup 43 has a lower end portion 43*a* having a cylindrical shape about the axis CX, an upper end portion 43*b* extending obliquely upwardly from the upper end of the lower end portion 43*a* toward the center (toward the axis CX of the substrate W) in the form of a smooth arc, and a folded portion 43*c* formed by folding back the distal end portion of the upper end portion 43*b* downwardly.

The lower end portion 43*a* is put inside the outer collection channel 51, with appropriate clearance left between the processing liquid separation wall 53 of the middle cup 42 and the outer wall portion 46 of the inner cup 41, when the inner cup 41 and the outer cup 43 are at their closest positions. The upper end portion 43*b* is provided over the second guide portion 52 of the middle cup 42, and is close to the upper end portion 52*b* of the second guide portion 52, with slight clearance left therebetween, when the middle cup 42 and the outer cup 43 are at their closest positions. The folded portion 43*c* formed by folding back the distal end portion of the upper end portion 43*b* downwardly is formed so as to be put in horizontally side-by-side relation to the folded portion 52*c* of the second guide portion 52 when the middle cup 42 and the outer cup 43 are at their closest positions.

The inner cup 41, the middle cup 42 and the outer cup 43 are upwardly and downwardly movable independently of each other. Specifically, the inner cup 41, the middle cup 42 and the outer cup 43 are provided with individual lifting mechanisms (not shown), and are moved upwardly and downwardly independently of each other by the individual lifting mechanisms. Examples of such lifting mechanisms used herein include various mechanisms including a ball screw mechanism, an air cylinder and the like.

The partition plate 15 is provided around the processing cup 40 so as to divide the inside space of the chamber 10 into upper and lower spaces. The partition plate 15 may be a single plate-like member surrounding the processing cup 40 or be comprised of a plurality of plate-like members joined together. The partition plate 15 may have a through hole formed therethrough in the thickness direction thereof, and a notch. In the present preferred embodiment, the partition plate 15 has through holes for passing therethrough support shafts for supporting the nozzle bases 33 and 63 of the upper surface processing liquid nozzle 30 and the two-fluid nozzle 60.

The partition plate 15 has outer peripheral edges coupled to the side walls 11 of the chamber 10. An edge portion of the partition plate 15 which surrounds the processing cup 40 has a circular shape with a diameter greater than the outside diameter of the outer cup 43. Thus, the partition plate 15 constitutes no obstacle to the upward and downward movement of the outer cup 43.

An exhaust duct 18 is provided near the floor wall 13 so as to extend through part of the side walls 11 of the chamber 10. The exhaust duct 18 is connected in communication with an exhaust mechanism not shown. Part of the clean air supplied from the fan filter unit 14 and flowing downwardly in the chamber 10 passes through the space lying between the processing cup 40 and the partition plate 15, and is then exhausted through the exhaust duct 18 to the outside of the substrate processing apparatus 1.

The substrate processing apparatus 1 further includes the controller 9 for controlling a processing apparatus body DB comprised of the aforementioned components. The controller 9 is similar in hardware configuration to a typical computer. Specifically, the controller 9 includes a CPU for performing various computation processes, a ROM or read-only memory for storing a basic program therein, a RAM or readable/writable memory for storing various pieces of information therein, and a magnetic disk for storing control software, data and the like therein.

A plurality of substrate processing modes in the substrate processing apparatus 1 are previously set in a storage part (such as the magnetic disk) of the controller 9 (a setting step). The CPU in the controller 9 executes a predetermined processing program to select and execute one of the aforementioned substrate processing modes (a processing executing step), whereby the operating mechanisms of the substrate processing apparatus 1 are controlled.

1.2 Operation of Substrate Processing Apparatus 1

Next, operating modes in the substrate processing apparatus 1 having the aforementioned configuration will be described.

The substrate processing apparatus 1 according to the present preferred embodiment has a normal mode NM (FIG. 3) which is set as a default mode among the plurality of modes, and a special mode RM (FIG. 7) which is selected by way of exception or temporarily when a specific condition is satisfied. The substrate processing apparatus 1 selects and executes one of the normal mode NM and the special mode RM on substrates W transported in succession to the substrate processing apparatus 1. One or more modes different from the aforementioned two modes NM and RM may be additionally set and selectable in the controller 9 of the substrate processing apparatus 1. However, an instance where only the aforementioned two modes NM and RM are set will be described in the present preferred embodiment.

<1.2.1 Normal Mode NM>

Figure 3:
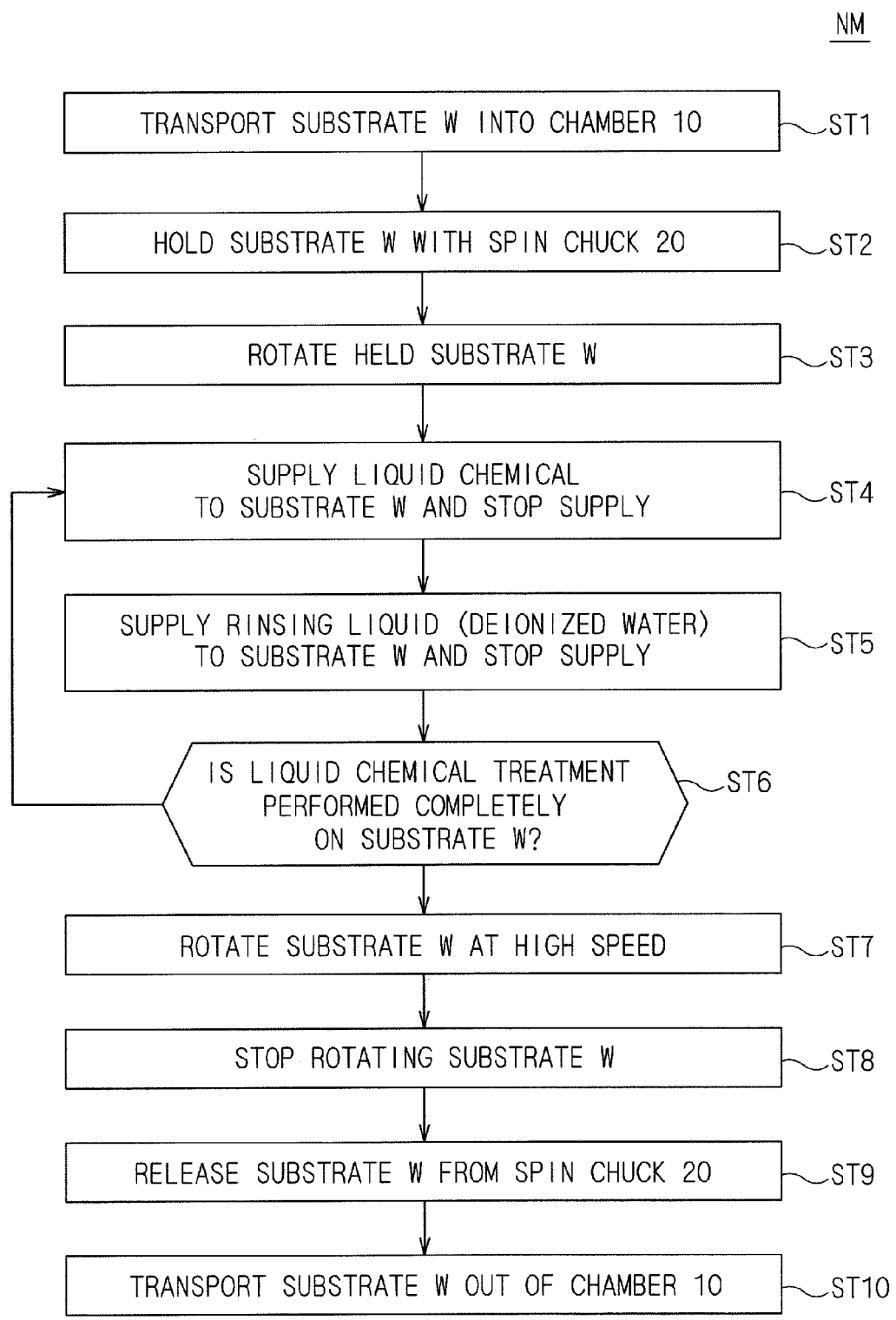
FIG. 3 is a flow diagram showing a normal mode according to the preferred embodiment.

FIG. 3 is a flow diagram showing a procedure for the normal mode NM in the substrate processing apparatus 1 according to the present preferred embodiment. The normal mode NM will be described with reference to FIG. 3.

First, a transport robot not shown transports a substrate W to be processed into the chamber 10 (Step ST1). The four chuck members 26 are driven, so that the substrate W is held by the spin chuck 20 (Step ST2). The spin motor 22 rotates the rotary shaft 24 to thereby rotate the substrate W about the axis CX passing through the center of the substrate W and extending in a vertical direction (Step ST3).

Next, the nozzle arm 32 of the upper surface processing liquid nozzle 30 is pivoted to move the ejection head 31 to over the spin base 21 (e.g., over the axis CX). Then, the liquid chemical is supplied from the upper surface processing liquid nozzle 30 onto the upper surface of the substrate W being rotated by the spin chuck 20. The liquid chemical supplied onto the upper surface of the substrate W spreads over the entire upper surface of the rotating substrate W by centrifugal force. Thus, the liquid chemical treatment of the substrate W proceeds (Step ST4). Then, the liquid chemical flies off (splashes outwardly) from the edge portion of the rotating substrate W to the surroundings.

Figure 4:
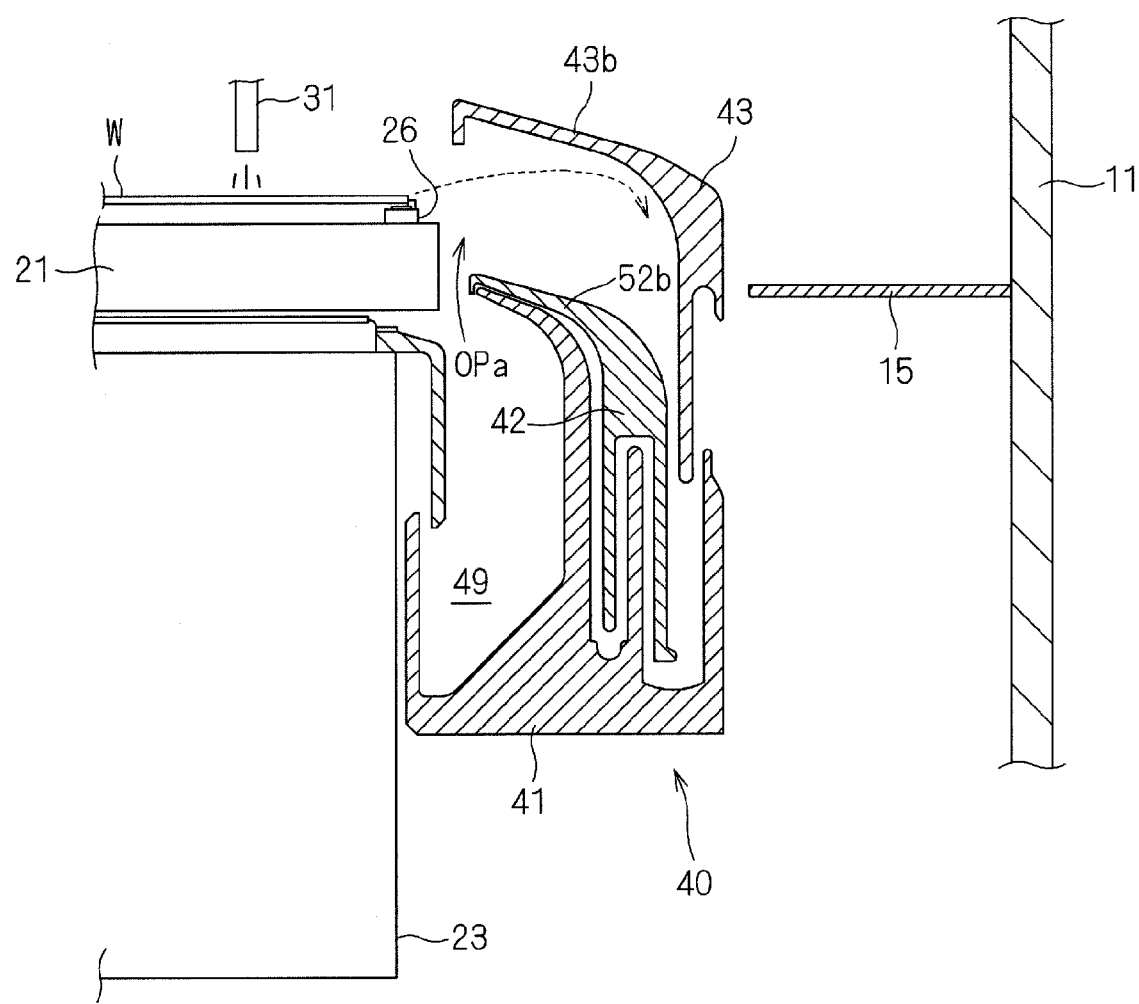
FIG. 4 is a vertical sectional view of the substrate processing apparatus which shows a liquid chemical flying off from a substrate toward an outer cup in the normal mode according to the preferred embodiment.

For the purpose of collecting the flown liquid chemical, only the outer cup 43, for example, moves upwardly in Step ST4, so that an opening OPa surrounding the substrate W held by the spin chuck 20 is formed between the upper end portion 43b of the outer cup 43 and the upper end portion 52b of the second guide portion 52 of the middle cup 42 (FIG. 4). As a result, the liquid chemical (indicated by a dotted arrow in FIG. 4) flown from the edge portion of the rotating substrate W is received by the upper end portion 43b of the outer cup 43, flows downwardly along the inner surface of the outer cup 43, and is collected by the outer collection channel 51. After a lapse of a predetermined period of time (or after a predetermined amount of liquid chemical is supplied), the supply of the liquid chemical is stopped.

Next, deionized water (the rinsing liquid) is supplied from the upper surface processing liquid nozzle 30 onto the upper surface of the substrate W being rotated by the spin chuck 20. The deionized water supplied onto the upper surface of the substrate W spreads over the entire upper surface of the rotating substrate W by centrifugal force. Thus, the rinsing treatment in which the liquid chemical remaining on the upper surface of the substrate W is rinsed away proceeds (Step ST5). Then, the deionized water flies off (splashes outwardly) from the edge portion of the rotating substrate W to the surroundings.

In Step ST5, all of the inner cup 41, the middle cup 42 and the outer cup 43, for example, move upwardly, so that the substrate W held by the spin chuck 20 is surrounded by the first guide portion 47 of the inner cup 41 (FIG. 5). As a result, the deionized water (indicated by a dotted arrow in FIG. 5) flown from the edge portion of the rotating substrate W is received by the inner cup 41, flows downwardly along the inner wall of the first guide portion 47, and is discharged from the waste channel 49. For collection of the deionized water via a route different from that for the liquid chemical, the middle cup 42 and the outer cup 43 may be moved upwardly, so that an opening OPb surrounding the substrate W held by the spin chuck 20 is formed between the upper end portion 52b of the second guide portion 52 of the middle cup 42 and the upper end portion 47b of the first guide portion 47 of the inner cup 41 (FIG. 6). After a lapse of a predetermined period of time (or after a predetermined amount of deionized water is supplied), the supply of the deionized water is stopped.

Then, Step ST4 (a first unit liquid chemical process) and Step ST5 (a first unit rinsing process) are alternately repeated until the liquid chemical treatment defined by a substrate processing recipe is completely performed (Step ST6). In the specification, Step ST4 executed a plurality of times on a single substrate W in the normal mode NM is referred to as a "first unit liquid chemical process", and a collective concept of the plurality of first unit liquid chemical processes in the normal mode NM is referred to as a "first liquid chemical process". Likewise, Step ST5 executed a plurality of times on a single substrate W in the normal mode NM is referred to as a "first unit rinsing process", and a collective concept of the plurality of first unit rinsing processes in the normal mode NM is referred to as a "first rinsing process".

After the first liquid chemical process and the first rinsing process are completed, a drying process is performed on the substrate W (Step ST7). For the drying process, all of the inner cup 41, the middle cup 42 and the outer cup 43 are moved downwardly, so that the upper end portion 47b of the first guide portion 47 of the inner cup 41, the upper end portion 52b of the second guide portion 52 of the middle cup 42 and the upper end portion 43b of the outer cup 43 are positioned below the substrate W held by the spin chuck 20. In this state, the substrate W is rotated with the spin chuck 20 at a high speed, so that droplets (droplets of the liquid chemical and droplets of water) adhering to the substrate W are spun off by centrifugal force. The drying process is performed in this manner.

After the drying process, the rotation of the substrate W is stopped (Step ST8). The four chuck members 26 are driven to release the substrate W from the spin chuck 20 (Step ST9). The transport robot not shown transports the substrate W out of the chamber 10 (Step ST10).

In the normal mode NM, the surface treatment is performed by supplying the processing liquid (the liquid chemical and the rinsing liquid (deionized water)) to the substrate W, as described above. The greater part of the processing liquid flown off from the rotating substrate W is collected by the processing cup 40 and discharged. However, some of the processing liquid flown off to the processing cup 40 remains adhering thereto without being discharged in some cases.

There is a danger that the processing liquid adhering to the interior of the cup in this manner produces particles, when dried, to become a source of contamination of the substrate W being processed. To prevent this, the substrate processing apparatus 1 according to the present preferred embodiment executes the special mode RM (FIG. 7) to be described below to clean the interior of the processing cup 40.

<1.2.2 Special Mode RM>

The special mode RM is a mode in which not only the substrate processing of a substrate W is performed as in the normal mode NM but also the cleaning of the interior of the processing cup 40 is performed. The special mode RM is a mode selected by way of exception or temporarily when a specific condition is satisfied, e.g. a mode applied to a substrate to be processed immediately after the condition is satisfied. The specific condition is previously set in the controller 9.

Examples of criteria in the case where a specific condition is satisfied include:

(1) "number criterion" in the case where a predetermined number of substrates are processed in the normal mode NM;

(2) "time criterion" in the case where the substrate processing apparatus 1 is operated for a predetermined period of time in the normal mode NM; and (3) "trouble cause occurrence criterion" in the case where the occurrence of trouble about the actual continuance of the high-accuracy substrate processing is detected, e.g. in the cases where any adherent to the interior of the processing cup 40 is detected by a sensor (not shown) and where contamination of an atmosphere in the processing space inside the chamber 10 is detected.

As for the "number criterion", the special mode RM is periodically executed using the number of substrates subjected to the liquid chemical treatment (substrate cleaning) as a criterion. As for the "time criterion", the special mode RM is periodically executed using time as a criterion. Based on these criteria (the number of substrates and time), the special mode RM is hence performed periodically.

As for the "trouble cause occurrence criterion", on the other hand, such causes of trouble do not always occur periodically. Thus, the special mode RM is executed non-periodically in many cases. Whether the execution is periodic or non-periodic, the number of substrates cleaned in the special mode RM is much less than the number of substrates cleaned in the normal mode NM.

Figure 7:
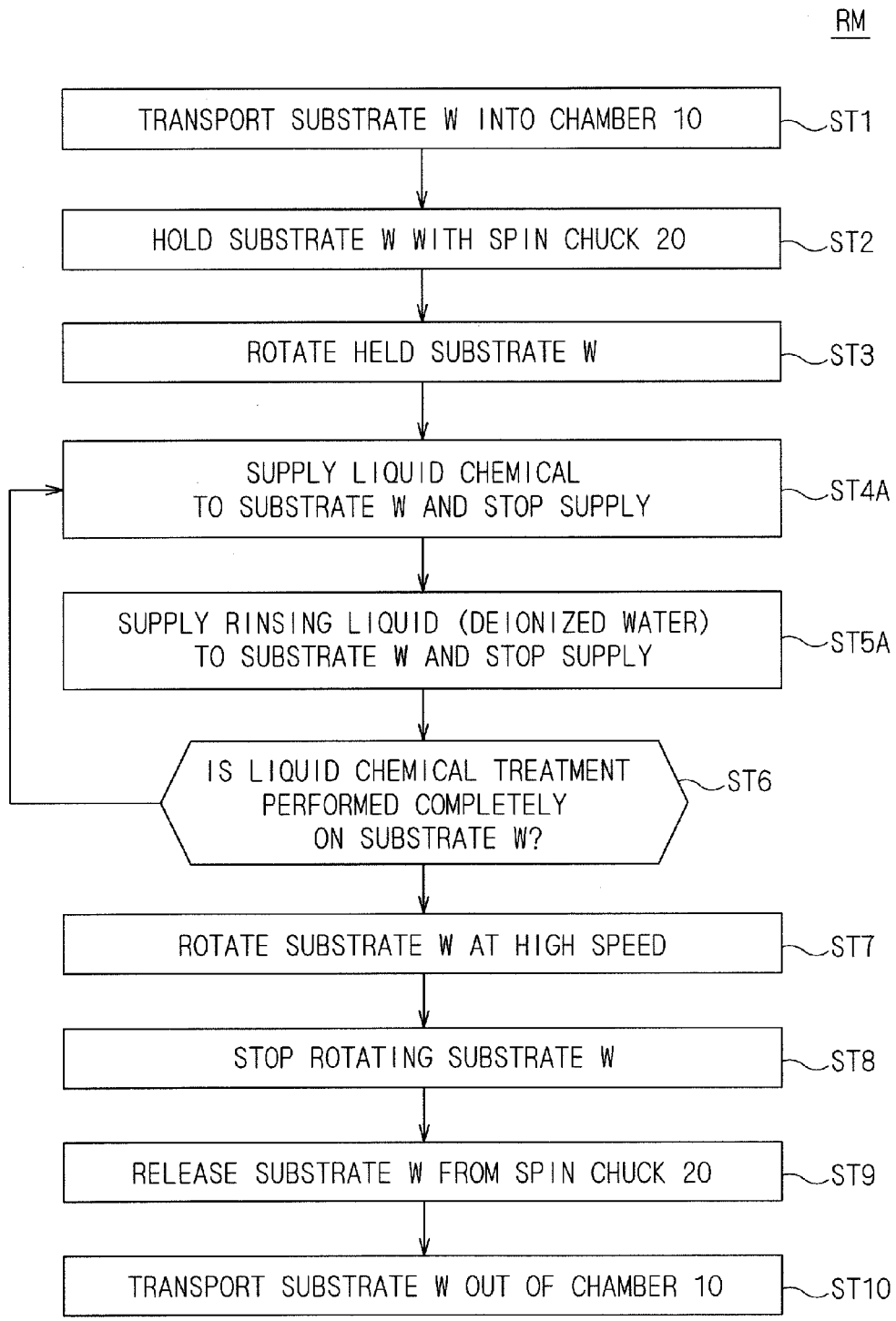
FIG. 7 is a flow diagram showing a special mode according to the preferred embodiment.

FIG. 7 is a flow diagram showing a procedure for the special mode RM in the substrate processing apparatus 1 according to the present preferred embodiment. As shown in FIG. 7, Steps ST1 to ST3, and ST6 to ST10 in the special mode RM are similar to those in the normal mode NM described above. Steps ST4A and ST5A inherent in the special mode RM will be described in detail below.

In the special mode RM, Step ST4A executed a plurality of times on a single substrate W is referred to as a "second unit liquid chemical process", and a collective concept of the plurality of second unit liquid chemical processes is referred to as a "second liquid chemical process". Likewise, Step ST5A executed a plurality of times on a single substrate W in the special mode RM is referred to as a "second unit rinsing process", and a collective concept of the plurality of second unit rinsing processes in the special mode RM is referred to as a "second rinsing process".

The second liquid chemical process in the special mode RM is a process corresponding to the first liquid chemical process in the normal mode NM, and has a plurality of second unit liquid chemical processes which supply the liquid chemical to the substrate W held and rotated by the spin chuck 20 to perform the liquid chemical treatment on the substrate W.

The second rinsing process in the special mode RM is similar to the first rinsing process in the normal mode NM in having a plurality of second unit rinsing processes which supply the rinsing liquid (deionized water) to the substrate W held and rotated by the spin chuck 20 to perform the rinsing treatment on the substrate W. The second rinsing process, however, differs from the aforementioned first rinsing process in having at least one second unit rinsing process (referred to hereinafter as a cup cleaning process) different in operating conditions from at least one of the first unit rinsing processes.

Figure 8:
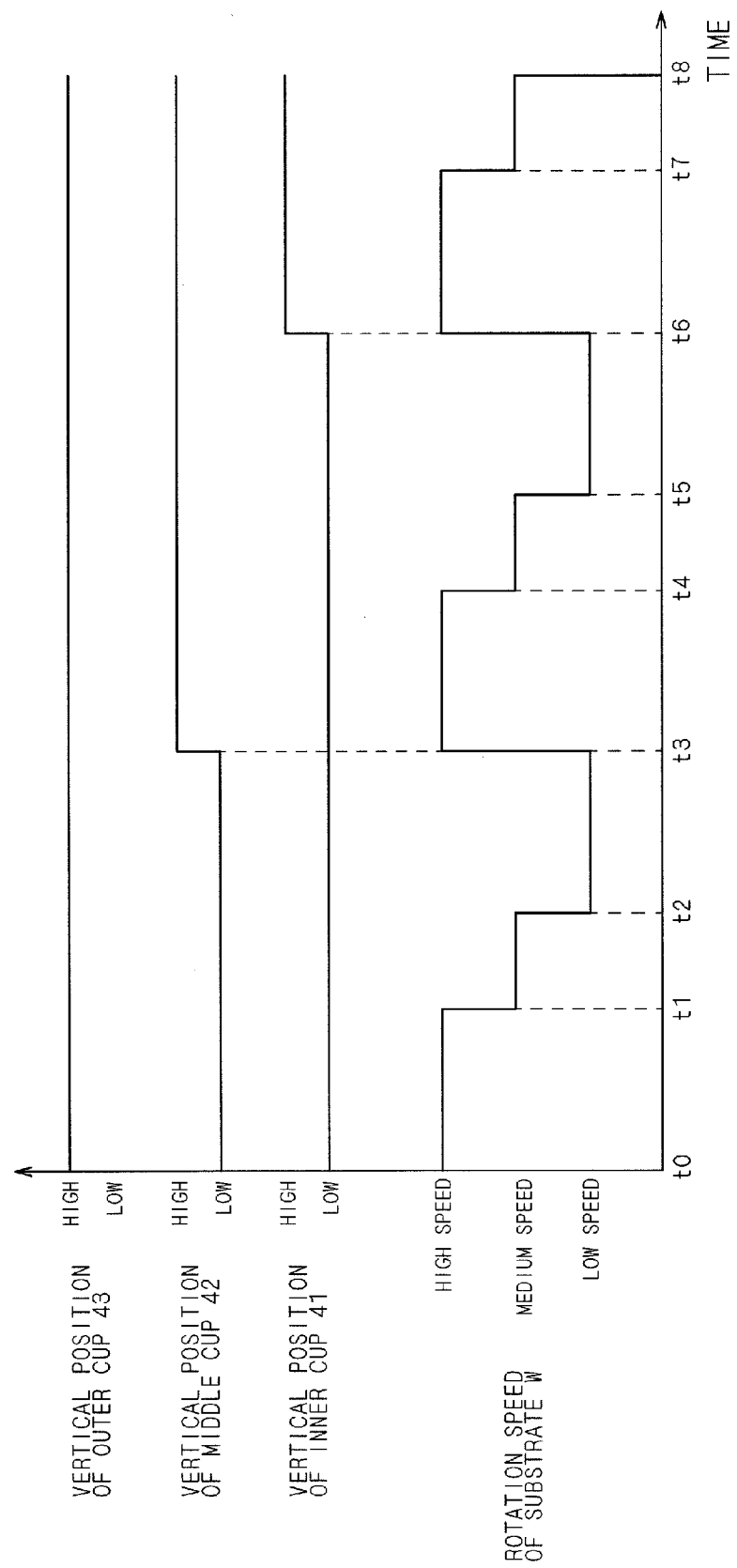
FIG. 8 is a timing diagram of a cup cleaning process according to the preferred embodiment.

FIG. 8 shows an example of a timing diagram of the cup cleaning process. Unlike other second unit rinsing processes intended primarily for the rinsing treatment of a substrate, the cup cleaning process is a process intended primarily for the rinsing treatment of a substrate and the cleaning treatment of the interior of the processing cup 40. The reference characters t0 to t9 designate times in the cup cleaning process.

In the early stage (a time period from the time t0 to the time t3 in FIG. 8) of the cup cleaning process, the inner cup 41 and the middle cup 42 are at their lowered positions, and the outer cup 43 is at its elevated position, so that the ring-shaped opening OPa surrounding the substrate W held by the spin chuck 20 is formed between the upper end portion 43b of the outer cup 43 and the upper end portion 52b of the second guide portion 52 of the middle cup 42 (FIG. 9).

During a time period from the time t0 to the time t1, the spin chuck 20 rotates the substrate W at a high speed (e.g. 2400 rpm). This causes the deionized water supplied from the upper surface processing liquid nozzle 30 onto the substrate W to fly off upwardly from the edge portion of the substrate W along a path indicated by a dotted arrow AR1 in FIG. 9. The deionized water flying through the opening OPa and adhering to the inner wall of the upper end portion 43b (especially, at positions close to the axis CX) flows downwardly along the inner wall, and is discharged from the outer collection channel 51 (FIG. 2). As a result, contaminants such as particles adhering to the inner wall of the outer cup 43 (especially, at positions close to the axis CX) are rinsed away by the deionized water.

During a time period from the time t1 to the time t2, the spin chuck 20 rotates the substrate W at a medium speed (e.g. 1200 rpm). This causes the deionized water supplied from the upper surface processing liquid nozzle 30 onto the substrate W to fly off substantially horizontally from the edge portion of the substrate W along a path indicated by a dotted arrow AR2 in FIG. 9. The deionized water flying through the opening OPa and adhering to the inner wall of the upper end portion 43b of the outer cup 43 (especially, at positions far from the axis CX) flows downwardly along the inner wall, and is discharged from the outer collection channel 51 (FIG. 2). As a result, contaminants such as particles adhering to the inner wall of the outer cup 43 (especially, at positions far from the axis CX) are rinsed away by the deionized water. The inner wall of the outer cup 43, especially at positions far from the axis CX, is where the deionized water already flowed downwardly also during the time period from the time t0 to the time t1. Thus, a sufficient cup cleaning effect is achieved even when the time period from the time t1 to the time t2 is shorter than the time period from the time t0 to the time t1, as shown in FIG. 8.

During a time period from the time t2 to the time t3, the spin chuck 20 rotates the substrate W at a low speed (e.g. 500 rpm). This causes the deionized water supplied from the upper surface processing liquid nozzle 30 onto the substrate W to fly off downwardly from the edge portion of the substrate W along a path indicated by a dotted arrow AR3 in FIG. 9. The deionized water flying through the opening OPa and adhering to the upper end portion 52b of the second guide portion 52 of the middle cup 42 flows downwardly along the upper surface of the upper end portion 52b, and is discharged from the outer collection channel 51 (FIG. 2). As a result, contaminants such as particles adhering to the upper end portion 52b of the second guide portion 52 of the middle cup 42 are rinsed away by the deionized water.

In this manner, the cup cleaning process has a speed adjustment sub-process which makes variable adjustments to the speed of rotation of the substrate W. The execution of the speed adjustment sub-process allows the deionized water to fly off through the opening OPa to a desired place in the section lying between the outer cup 43 and the middle cup 42.

In the middle stage (a time period from the time t3 to the time t6) of the cup cleaning process, the inner cup 41 is at its lowered position, and the middle cup 42 and the outer cup 43 are at their elevated positions, so that the opening OPb surrounding the substrate W held by the spin chuck 20 is formed between the upper end portion 52b of the second guide portion 52 of the middle cup 42 and the upper end portion 47b of the first guide portion 47 of the inner cup 41 (FIG. 10).

The speed adjustment sub-process is performed also during the time period from the time t3 to the time t6 in a manner similar to that during the time period from the time t0 to the time t3. As a result, the deionized water flies off through the opening OPb formed between the middle cup 42 and the inner cup 41 along paths indicated by dotted arrows AR4, AR5 and AR6 (FIG. 10) in accordance with the high, medium and low speeds, respectively, of the speed of rotation of the substrate W. Thus, contaminants such as particles adhering to the inner wall of the second guide portion 52 of the middle cup 42 and the upper surface of the first guide portion 47 of the inner cup 41 are rinsed away by the deionized water.

In the late stage (a time period from the time t6 to the time t8) of the cup cleaning process, all of the inner cup 41, the middle cup 42 and the outer cup 43 are at their elevated positions, so that the first guide portion 47 of the inner cup 41 surrounds the substrate W held by the spin chuck 20 (FIG. 11).

The speed adjustment sub-process is performed also during the time period from the time t6 to the time t8 in a manner similar to that during the time period from the time t0 to the time t2 and during the time period from the time t3 to the time t5. As a result, the deionized water flies off through an opening OPc inside the inner cup 41 along paths indicated by dotted arrows AR7 and AR8 (FIG. 11) in accordance with the high and medium speeds, respectively, of the speed of rotation of the substrate W. Thus, contaminants such as particles adhering to the inner wall of the first guide portion 47 of the inner cup 41 are rinsed away by the deionized water. The low-speed rotation of the substrate W is not performed in the late stage of the cup cleaning process because there is no cup to be cleaned (corresponding to the middle cup 42 in the early stage of the cup cleaning process, and the inner cup 41 in the middle stage thereof) inside the inner cup 41.

In this manner, the cup cleaning process has the speed adjustment sub-process which makes variable adjustments to the speed of rotation of the substrate W, and a place adjustment sub-process which moves the processing cup 40 upwardly and downwardly to adjust the place where the deionized water flying off from the substrate W collides with the processing cup 40. These sub-processes are combined as appropriate to allow the cleaning of each part of the processing cup 40 (to allow deionized water to fly off to each part of the processing cup 40) accurately.

Referring again to FIG. 7, a series of processes in the special mode RM will be described. First, a substrate W to be processed is transported into the chamber 10 (Step ST1). Then, the substrate W is held by the spin chuck 20 (Step ST2). The spin motor 22 rotates the substrate W about the axis CX (Step ST3).

Then, the second unit liquid chemical process (Step ST4A) and the second unit rinsing process (Step ST5A) are performed alternately a predetermined number of times in accordance with the recipe. At this time, the aforementioned cup cleaning process different in operating conditions from the first unit rinsing process (Step ST5) is performed as at least one of the second unit rinsing processes (Step ST5A).

After the second liquid chemical process and the second rinsing process are completed, the drying process is performed on the substrate W (Step ST7). Thereafter, the rotation of the substrate W is stopped (Step ST8). The four chuck members 26 are driven to release the substrate W from the spin chuck 20 (Step ST9). The transport robot not shown transports the substrate W out of the chamber 10 (Step ST10). In the special mode RM, the rinsing liquid (deionized water) used for the purpose of rinsing away the liquid chemical from over the substrate W is used also for the cleaning of the cup, as described above.

1.3 Effects of Substrate Processing Apparatus 1

Effects of the substrate processing apparatus 1 according to the present preferred embodiment will be described.

The special mode RM, in which the aforementioned cup cleaning process is performed by modifying part of the normal mode NM, achieves the cleaning treatment of the processing cup 40 in addition to the substrate processing. This effectively rinses away a source of contamination adhering to the interior of the cup to improve the yield of the substrate processing apparatus 1.

The cup cleaning process included in the second rinsing process has the speed adjustment sub-process and the place adjustment sub-process. These sub-processes may be combined as appropriate to allow the cleaning of each part of the processing cup 40 (to allow deionized water to fly off to each part of the processing cup 40) accurately.

In the cup cleaning process in the special mode RM, the rinsing liquid is supplied to a substrate W to be processed under operating conditions (long or short rinsing liquid supply time, a large or small number of rotations of the substrate W, whether to move the cup upwardly and downwardly or not, and the like) different from those in the normal mode NM. In an instance where deionized water is used as the rinsing liquid as in the present preferred embodiment or where a sufficiently diluted liquid chemical is used as the rinsing liquid, the adverse effect of the difference in the aforementioned operating conditions from those in the normal mode NM upon the substrate W is prevented (the reduction in yield is prevented).

The special mode RM is a mode executable in timed relation to the placement of a substrate W in the chamber 10. In this manner, the execution of the special mode RM subjects to less tight time constraints. Thus, if there arises a need to perform the cleaning of the processing cup 40 in the middle of lot processing (in the case where there arises a need to clean the interior of the cup, based on the aforementioned "trouble cause occurrence criterion", e.g. in the cases where a source of contamination adhering to the processing cup 40 is detected by a sensor and where contamination of an atmosphere inside the chamber 10 is detected), the special mode RM may be performed before the completion of the lot processing being performed.

The special mode RM according to the present preferred embodiment is executed while the substrate W is mounted on the spin chuck 20. Unlike the technique of supplying the rinsing liquid (deionized water) to the rotating spin base to fly off the rinsing liquid as in U.S. Patent Application Publication No. 2012/273011, the preferred embodiment reduces the danger that the rinsing liquid collides with the chuck mechanisms (typically, of a protruding shape) for grasping the substrate to allow the rinsing liquid to fly off appropriately to the places to be cleaned to which the liquid chemical adheres.

The components, such as the spin chuck 20, the processing cup 40 and the upper surface processing liquid nozzle 30, inside the chamber 10 are used originally for the surface treatment of the substrate W, and are not provided for the purpose of cleaning other than the substrate W. The present preferred embodiment prevents the increase in size of the substrate processing apparatus 1 because the controller 9 makes a mode selection to thereby cause the rinsing treatment of the processing cup 40 to be performed without the provision of a mechanism (a cleaning tool and the like) designed specifically for the cleaning of the processing cup 40.

In particular, the speed of rotation of the substrate W is variably adjustable. As shown in FIG. 9, the ejection and flying of the rinsing liquid are caused while the number of rotations is changed during the time period of cleaning of the inner wall of the cup. This allows the cleaning of a wide area of the inner wall of the cup in such a manner as to vertically scan the inner wall of the cup. The number of rotations may be changed stepwise as in the present preferred embodiment or be continuously changed with time.

2 Modifications

While the preferred embodiment according to the present invention has been described hereinabove, various modifications of the present invention in addition to those described above may be made without departing from the scope and spirit of the invention. For example, the rinsing liquid for use in the first rinsing process and the second rinsing process is deionized water in the aforementioned preferred embodiment, but is not limited to this. A liquid chemical diluted with deionized water may be used as the rinsing liquid. The normal mode NM and the special mode RM described above are merely examples of the processing modes. For example, another mode in which the processing liquid is supplied from the lower surface processing liquid nozzle 28 to the lower surface of the substrate W may be employed.

FIGS. 12 and 13 are timing diagrams of the cup cleaning process according to modifications of the aforementioned preferred embodiment.

The cup cleaning process may have a supply amount adjustment sub-process which makes variable adjustments to the amount of rinsing liquid (deionized water) supplied to the substrate W. For example, as shown in FIG. 12, when the amount of supplied deionized water is increased only during time periods (from the time t0 to the time t1, from the time t3 to the time t4, and from the time t6 to the time t7) where the substrate W is rotated at a high speed for the purpose of cleaning the places of the processing cup 40 close to the substrate W, a source of contamination adhering to the processing cup 40 at the positions close to the substrate W (a source of contamination with a high apprehension about the contamination of the substrate W) is effectively rinsed away.

In the place adjustment sub-process in which the processing cup 40 is moved upwardly and downwardly, the upward and downward movement of the processing cup 40 may be repeated in a fixed vertical section, as shown in FIG. 13. In the section where the upward and downward movement is repeated, the rinsing liquid (deionized water) is flown off evenly to the processing cup 40, so that a source of contamination is effectively rinsed away over a wide area. When the processing cup 40 is moved upwardly and downwardly, it is effective to change the speed of the upward and downward movement in accordance with the vertical position of the processing cup 40. For example, the processing cup 40 may be rapidly moved upwardly and downwardly in a position where a few sources of contamination adhere to the processing cup 40 whereas the processing cup 40 is slowly moved upwardly and downwardly in a position where a lot of sources contamination adhere to the processing cup 40, whereby the cup cleaning treatment is performed efficiently.

The upper surface processing liquid nozzle 30 is used as a rinsing liquid supply nozzle for supplying the rinsing liquid to the upper surface of the substrate W in the aforementioned preferred embodiment. In place of the upper surface processing liquid nozzle 30, the two-fluid nozzle 60 may be used to supply the rinsing liquid to the spin base 21.

In the aforementioned preferred embodiment, the processing cup 40 includes the inner cup 41, the middle cup 42 and the outer cup 43 which are upwardly and downwardly movable independently of each other. These cups 41, 42 and 43, however, may be integrally formed and moved upwardly and downwardly. When integrally stacked in multiple tiers in the height direction, the three cups may be moved upwardly and downwardly so as to surround the holding surface 21a of the spin base 21 in sequential order. Alternatively, the processing cup 40 may include only one cup surrounding the spin base 21.

The substrate to be processed by the substrate processing apparatus 1 is not limited to a semiconductor substrate, but may include a variety of substrates such as a glass substrate for use in a flat panel display for a liquid crystal display apparatus.

In the normal mode NM described above in the aforementioned preferred embodiment, the first liquid chemical process includes the plurality of first unit liquid chemical processes, and the first rinsing process includes the plurality of first unit rinsing processes. The present invention, however, is not limited to this. Specifically, the first liquid chemical process may include a single first unit liquid chemical process, and the first rinsing process may include a single first unit rinsing process (i.e., the liquid chemical treatment is performed once and the rinsing treatment is performed once). The same holds true for the second liquid chemical process and the second rinsing process.

Figure 14:
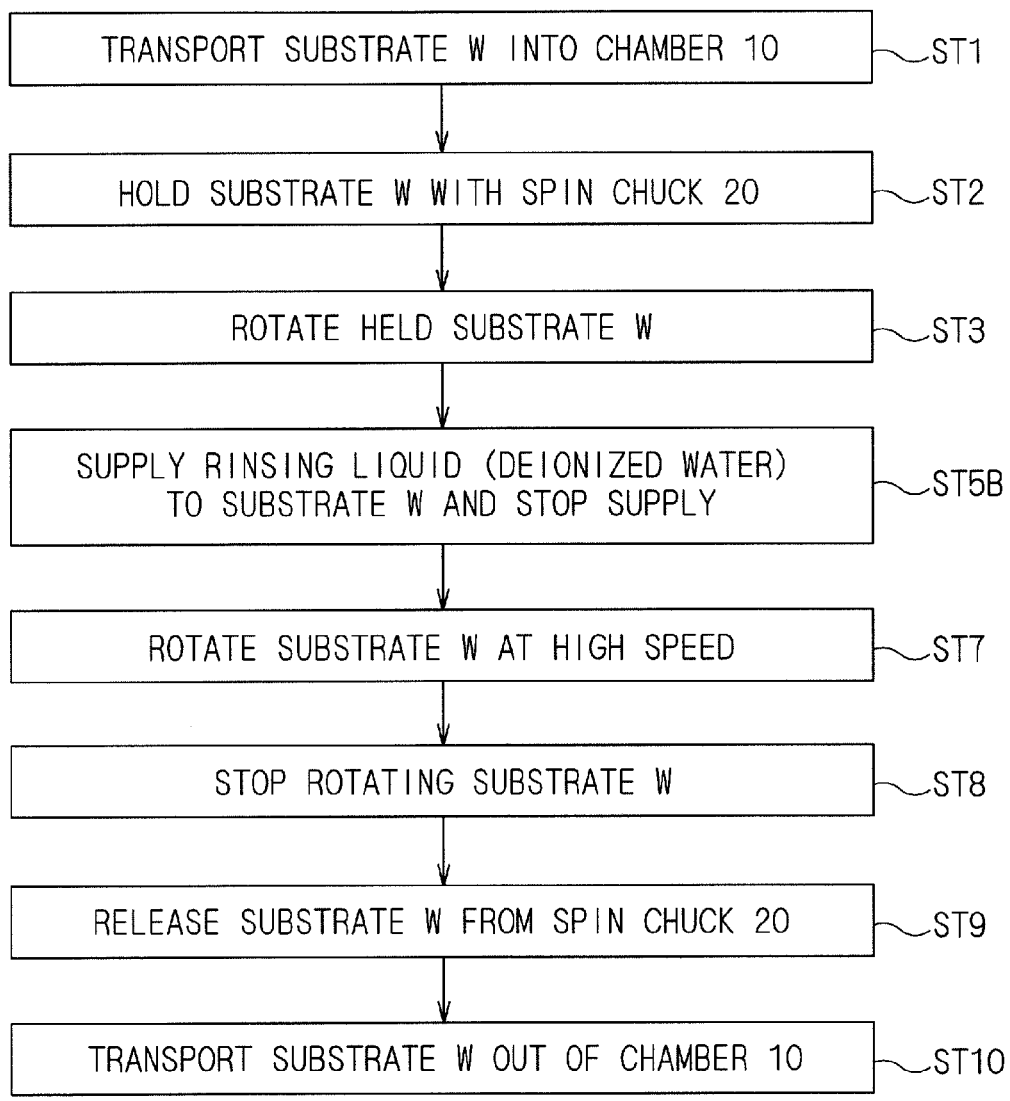
FIG. 14 is a flow diagram showing the special mode according to a modification.

The instance where the special mode RM has the second liquid chemical process is described in the aforementioned preferred embodiment. The present invention, however, is not limited to this. It is sufficient that the special mode RM has at least the second rinsing process (Step ST5B), and the special mode RM need not have the second liquid chemical process, as shown in FIG. 14. This instance is an instance where the substrate W is not used as a final product, and has advantages in requiring a short period of time because the second liquid chemical process is not performed, in being able to supply the deionized water powerfully enough to damage the substrate W, and in being able to use a rinsing liquid which cannot be used for the substrate W used as a final product from the viewpoint of substrate processing but which is effective for cup cleaning. This instance is hence particularly effective for a substrate W which cannot be basically used as a final product because of the influence of a flaw therein and the like in a step prior to the transport into the chamber 10.

FIG. 15 is a vertical sectional view of the substrate processing apparatus 1 in the case where liquid-tight cleaning is performed in the cup cleaning process. As will be apparent from a comparison with FIG. 9, the opening OPa formed between the upper end portion 43b of the outer cup 43 and the upper end portion 52b of the second guide portion 52 of the middle cup 42 in FIG. 15 has a small vertical dimension. Thus reducing the distance between the cups (between the outer cup 43 and the middle cup 42 in FIG. 15) to be cleaned causes the space between the cups to be filled with the deionized water (indicated by dotted arrows in the FIG. 15) flown off and supplied from the substrate W, thereby achieving efficient cup cleaning.

Although the substrate processing apparatus and the substrate processing method according to the preferred embodiment and the modifications thereof have been described hereinabove, these are examples of the preferred embodiments preferable for the present invention, and are not intended to limit the scope of the practice of the invention. The preferred embodiments may be freely combined, and any component in the preferred embodiments may be modified or omitted within the scope of the present invention.

While the invention has been described in detail, the foregoing description is in all aspects illustrative and not restrictive. It is understood that numerous other modifications and variations can be devised without departing from the scope of the invention.

What is claimed is:

1. A method of processing a plurality of substrates belonging to the same lot in succession by using a processing apparatus body and a controller for controlling said processing apparatus body, said processing apparatus body including a substrate holding part for holding a substrate, a rotary drive part for rotating said substrate holding part, a liquid chemical supply part for supplying a liquid chemical to said substrate held by said substrate holding part, a rinsing liquid supply part for supplying a rinsing liquid to said substrate held by said substrate holding part, and a cup surrounding said substrate holding part, said method comprising the steps of:
   (a) previously setting a plurality of substrate processing modes in said controller;
   (b) selecting one of said substrate processing modes set in said controller for each of said plurality of substrates to cause the selected substrate processing mode to be executed; and
   (c) detecting an occurrence of trouble in said processing execution step, said substrate processing modes including:
   (A) a normal mode applying to a first substrate which is a substrate belonging to said lot to be executed in the case where the occurrence of said trouble is not detected in said detecting step,
   wherein said normal mode having a first liquid chemical process which supplies the liquid chemical to said first substrate while rotating said first substrate held by said substrate holding part to perform liquid chemical treatment on said first substrate, and a first rinsing process which supplies the rinsing liquid to said first substrate while rotating said first substrate held by said substrate holding part to rinse away the liquid chemical from said first substrate; and
   (B) a special mode applying to a second substrate which is a substrate belonging to said lot and to be processed after the time point of detecting the occurrence of said trouble in the case where the occurrence of said trouble is detected in said detecting step,
   wherein said special mode having a second liquid chemical process which corresponds to said first liquid chemical process in said normal mode and a second rinsing process which supplies the rinsing liquid to said second substrate while rotating said second substrate held by said substrate holding part under an operating condition different from that in said first rinsing process to clean said cup with the rinsing liquid flown off from the rotating second substrate while rinsing away said liquid chemical from said second substrate, executing at least one of the processes of a positional adjustment sub-process which adjusts a portion where the rinsing liquid flowing off from said second substrate makes contact with said cup by vertically moving said cup, a speed adjustment sub-process which adjusts a rotation speed of said second substrate variable, and a supply quantity adjustment sub-process which adjusts a supply quantity of said rinsing liquid to said second substrate.

2. The method according to claim 1, wherein:
said first liquid chemical process has a plurality of first unit liquid chemical processes;
said first rinsing process has a plurality of first unit rinsing processes;
said normal mode is a processing mode in which each of said first unit liquid chemical processes and each of said first unit rinsing processes are performed alternately;
said second liquid chemical process has a plurality of second unit liquid chemical processes;
said second rinsing process has a plurality of second unit rinsing processes;
said special mode is a processing mode in which each of said second unit liquid chemical processes and each of said second unit rinsing processes are performed alternately; and
at least one of said second unit rinsing processes is performed under an operating condition different from at least corresponding one of said first unit rinsing processes.

3. The method according to claim 1, wherein
said second rinsing process in said special mode has a speed adjustment sub-process which makes a variable adjustment to the speed of rotation of said substrate.

4. The method according to claim 1, wherein
said second rinsing process in said special mode has a supply amount adjustment sub-process which makes a variable adjustment to the amount of rinsing liquid supplied to said substrate.

5. The method according to claim 1, wherein
said second rinsing process in said special mode has a place adjustment sub-process which moves said cup upwardly and downwardly to adjust the place where said rinsing liquid flying off from said substrate collides with said cup.

6. The method according to claim 5, wherein
the speed at which said cup is moved upwardly and downwardly is changed in accordance with the vertical position of said cup.

7. The method according to claim 5, wherein
said cup is moved upwardly and downwardly repeatedly in a fixed vertical section.

* * * * *